United States Patent
Yun et al.

(10) Patent No.: US 11,667,786 B2
(45) Date of Patent: Jun. 6, 2023

(54) ENCAPSULATING OR FILLING COMPOSITION FOR ELECTRONIC DEVICES AND ELECTRONIC APPARATUS

(71) Applicant: SAMSUNG DISPLAY CO., LTD., Yongin-si (KR)

(72) Inventors: Wonmin Yun, Yongin-si (KR); Yohan Kim, Yongin-si (KR); Jongjin Park, Yongin-si (KR); Byoungduk Lee, Yongin-si (KR); Yunah Chung, Yongin-si (KR); Yoonhyeung Cho, Yongin-si (KR); Youngcheol Joo, Yongin-si (KR); Yongchan Ju, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 136 days.

(21) Appl. No.: 17/202,957

(22) Filed: Mar. 16, 2021

(65) Prior Publication Data

US 2021/0292546 A1 Sep. 23, 2021

(30) Foreign Application Priority Data

Mar. 19, 2020 (KR) .................. 10-2020-0034044

(51) Int. Cl.
| | | |
|---|---|---|
| H01L 51/52 | (2006.01) | |
| H01L 51/50 | (2006.01) | |
| C08L 63/10 | (2006.01) | |
| C08L 63/00 | (2006.01) | |
| C08G 59/70 | (2006.01) | |
| C08G 59/14 | (2006.01) | |
| C08G 59/44 | (2006.01) | |
| C08G 59/50 | (2006.01) | |
| C08G 59/68 | (2006.01) | |
| C08L 63/04 | (2006.01) | |
| C08K 5/00 | (2006.01) | |

(52) U.S. Cl.
CPC ............ *C08L 63/10* (2013.01); *C08G 59/145* (2013.01); *C08G 59/44* (2013.01); *C08G 59/5006* (2013.01); *C08G 59/5033* (2013.01); *C08G 59/68* (2013.01); *C08L 63/04* (2013.01); *H01L 51/5237* (2013.01); *C08K 5/005* (2013.01); *C08L 2203/206* (2013.01)

(58) Field of Classification Search
CPC ..... H01L 51/50; H01L 51/52; H01L 51/5237; C08L 63/00; C08L 63/10; C08G 59/68; C08G 59/70
USPC .......................... 523/427, 457; 257/788, 793
See application file for complete search history.

(56) References Cited

U.S. PATENT DOCUMENTS

| | | | | |
|---|---|---|---|---|
| 5,252,694 A | * | 10/1993 | Willett .................. | C08G 59/68 522/18 |
| 2005/0285513 A1 | | 12/2005 | Choi et al. | |
| 2012/0022183 A1 | * | 1/2012 | Haute .................... | C08L 33/10 525/530 |
| 2017/0327717 A1 | | 11/2017 | Schuh et al. | |
| 2019/0169470 A1 | | 6/2019 | Dollase et al. | |
| 2020/0006437 A1 | * | 1/2020 | Kim ..................... | H01L 27/322 |
| 2020/0290267 A1 | * | 9/2020 | Hilton .................. | G03F 7/0037 |

FOREIGN PATENT DOCUMENTS

| | | |
|---|---|---|
| EP | 1901390 | 3/2008 |
| JP | 5763280 | 8/2015 |
| KR | 10-2006-0000747 | 1/2006 |
| KR | 10-2010-0081546 | 7/2010 |
| KR | 10-1251121 | 4/2013 |
| KR | 10-1802592 | 12/2017 |
| KR | 10-2019-0003713 | 1/2019 |
| WO | 2015002100 | 1/2015 |
| WO | 2016066435 | 5/2016 |

OTHER PUBLICATIONS

European Search Report dated Aug. 18, 2021, for European Patent Application No. 21163387.0 (6 pages).
Moreno, et al., "Enantioselective Epoxide Ring Opening of Styrene Oxide with Jacobsen's Salen(Co) Catalyst", Wednesday Evening Chem 250 Laboratory, Fall 2014, 15 pages.
Jamieson, et al., "Divergent Reactivity via Cobalt Catalysis: An Epoxide Olefination", Org. Lett. 2016, 18, 3, 468-471.

* cited by examiner

*Primary Examiner* — Michael J Feely
(74) *Attorney, Agent, or Firm* — F. Chau & Associates, LLC

(57) ABSTRACT

Provided are an encapsulating or filling composition for electronic devices and an electronic apparatus. The encapsulating or filling composition includes a curable material containing an epoxy group, a polymerization initiator, and a metal catalyst. The electronic apparatus includes a first substrate, an electronic device disposed on the first substrate, and one or more cured materials of the encapsulating or filling composition formed on the electronic device.

19 Claims, 4 Drawing Sheets

ENCAPSULATING OR FILLING
COMPOSITION FOR ELECTRONIC
DEVICES AND ELECTRONIC APPARATUS

CROSS-REFERENCE TO RELATED
APPLICATION

This application claims the benefit under 35 U.S.C. § 119 of Korean Patent Application No. 10-2020-0034044, filed on Mar. 19, 2020, in the Korean Intellectual Property Office, the disclosure of which is incorporated by reference herein in its entirety.

TECHNICAL FIELD

Exemplary embodiments of the present inventive concept relate to an encapsulating or filling composition for electronic devices and an electronic apparatus.

DISCUSSION OF RELATED ART

Organic light-emitting devices (OLEDs) or quantum dot light-emitting devices are self-light-emitting devices that, as compared with conventional electronic devices, have wide viewing angles, high contrast ratios, short response times, and excellent characteristics in terms of brightness, driving voltage, and response speed, and produce full-color images.

An electronic apparatus including such an electronic device may be used in various environments, and the electronic device may be damaged by water penetration, and thus it is desirable to have an encapsulation structure capable of protecting the electronic device in the electronic apparatus, for example, having the capability of preventing external water from penetrating into the electronic device.

SUMMARY

Exemplary embodiments of the present inventive concept include an encapsulating or filling composition for electronic devices and an electronic apparatus, the encapsulating or filling composition having enhanced water removal performance.

Additional aspects will be set forth in part in the description which follows and, in part, will be apparent from the description, or may be learned by practice of the presented exemplary embodiments of the present inventive concept.

According to an exemplary embodiment of the present inventive concept, an encapsulating or filling composition for electronic devices may include a first curable material containing an epoxy group, a polymerization initiator, and a metal catalyst.

According to an exemplary embodiment of the present inventive concept, an electronic apparatus may include a first substrate, an electronic device disposed on the first substrate, and one or more cured materials of an encapsulating or filling composition formed on the electronic device, in which the encapsulating or filling composition may include a curable material containing an epoxy group, a polymerization initiator, and a metal catalyst.

According to an exemplary embodiment of the present inventive concept, an electronic apparatus may include a first substrate, an electronic device disposed on the first substrate, an encapsulating member formed on the electronic device, encapsulating the electronic device, and including a first cured material of an encapsulating or filling composition, a second substrate disposed on the encapsulating member, and a filling member formed between the encapsulating member and the second substrate, and including a second cured material of the encapsulating or filling composition, in which the encapsulating or filling composition may include a curable material containing an epoxy group, a polymerization initiator, and a metal catalyst.

BRIEF DESCRIPTION OF THE DRAWINGS

The above and other aspects and features of the present inventive concept will be more apparent from the following description of the exemplary embodiments taken in conjunction with the accompanying drawings, in which.

Figure 1:
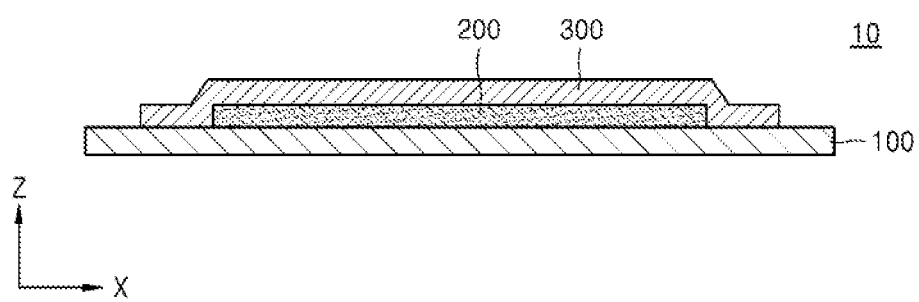
FIG. 1 is a schematic cross-sectional view of an electronic apparatus according to an exemplary embodiment of the present inventive concept.

Since the drawings in FIGS. 1-4 are intended for illustrative purposes, the elements in the drawings are not necessarily drawn to scale. For example, some of the elements may be enlarged or exaggerated for clarity purpose.

DETAILED DESCRIPTION OF THE
EMBODIMENTS

Reference will now be made in detail to exemplary embodiments of the present inventive concept, examples of which are illustrated in the accompanying drawings, in which like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present inventive concept. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. The expression "at least one of a and b" indicates only a, only b, both a and b, or variations thereof.

As the present inventive concept allows for various changes and numerous exemplary embodiments, particular exemplary embodiments will be illustrated in the drawings and described in detail in the written description. Effects, features, and a method of achieving the present inventive concept will be obvious by referring to the exemplary embodiments of the present inventive concept with reference to the accompanying drawings. The present inventive concept may, however, be embodied in many different forms and should not be construed as being limited to the specific exemplary embodiments set forth herein.

Hereinafter, the present inventive concept will be described in detail by explaining exemplary embodiments of the present inventive concept with reference to the accompanying drawings. Like reference numerals in the drawings denote like elements, and thus their description will be omitted.

In the exemplary embodiments described in the present specification, an expression used in the singular encompasses the expression of the plural, unless it has a clearly different meaning in the context.

In the present specification, it is to be understood that the terms such as "including", "having" and "comprising" are intended to indicate the existence of the stated features or components in the specification, and are not intended to preclude the presence or addition of one or more other features or components.

In the following exemplary embodiments, terms such as "first" and "second" are used only to distinguish one component from another component.

In the following exemplary embodiments, the x-axis, y-axis, and z-axis are not limited to three axes on the orthogonal coordinates system, and may be interpreted in a broad sense including the orthogonal coordinates system. For example, the x-axis, y-axis, and z-axis may be orthogonal to each other, but the x-axis, y-axis, and z-axis may also refer to different directions that are not orthogonal to each other.

It will be understood that when a layer, region, or component is referred to as being "on" or "onto" another layer, region, or component, it may be directly formed over the other layer, region, or component, or may be indirectly formed over the other layer, region, or component with one or more intervening layers, regions, or components interposed therebetween.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

[Encapsulating or filling composition for electronic devices]

An encapsulating or filling composition for electronic devices according to an exemplary embodiment of the present inventive concept may include:
a first curable material containing an epoxy group;
a polymerization initiator; and
a metal catalyst.

The encapsulating or filling composition may remove water, as the first curable material may include an epoxy group, and the metal catalyst may catalyze a chemical reaction between the epoxy group and water ($H_2O$). For example, catalyzed by the metal catalyst, the epoxy group may react with water ($H_2O$) to form 1,2-diols. In this case, water is consumed after the reaction, and is not available for outgassing. Swelling may occur to a polymer, when the polymer is exposed to a humid environment, it absorbs some water by diffusion. By eliminating the absorbed water in the polymer may prevent the occurrence of the swelling. Accordingly, when the encapsulating or filling composition is applied to an encapsulating member in an electronic apparatus, the encapsulating member may be prevented from being deteriorated due to outgassing or swelling and may exhibit enhanced durability. In addition, the encapsulating member may exhibit enhanced water removal performance, thus enabling simplification of a structure of an encapsulating member and a manufacturing process thereof.

In an exemplary embodiment of the present inventive concept, the first curable material may be a monomer containing an epoxy group and a (meth)acrylate group. Here, the term "(meth)acrylate" means methacrylate or acrylate.

In an exemplary embodiment of the present inventive concept, the first curable material may include an epoxy (meth)acrylate compound represented by Formula 1:

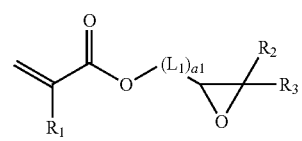

Formula 1 wherein, in Formula 1,
$R_1$ may be hydrogen or a methyl group,
$L_1$ may be —O—, —S—, $S(=O)_2$—, —C(=O)—, —C(=O)O—, —C(=O)NH—, —N($R_4$)—, —C($R_4$)($R_5$)—, —Si($R_4$)($R_5$)—, or $C_1$-$C_{20}$ alkylene group,
$R_2$ to $R_5$ may each independently be selected from hydrogen, deuterium, —F, —Cl, —Br, —I, a hydroxyl group, a cyano group, an epoxy group, a nitro group, an amidino group, a hydrazino group, a hydrazono group, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $O_1$—$O_{20}$ alkoxy group, and
a1 may be an integer from 1 to 5.

In an exemplary embodiment of the present inventive concept, the epoxy (meth)acrylate compound may be Compound 1-1 and/or Compound 1-2:

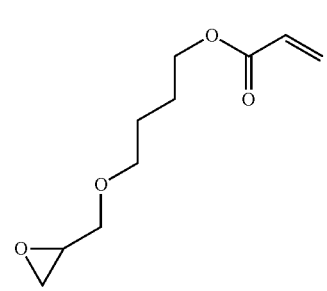

Compound 1-1

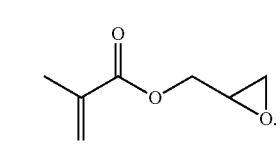

Compound 1-2

In an exemplary embodiment of the present inventive concept, a content of the first curable material may be in a range from about 1 part to about 50 parts by weight, for example, from about 1 parts to about 30 parts, or, from about 1 part to about 20 parts by weight, based on 100 parts by weight of the encapsulating or filling composition.

In an exemplary embodiment of the present inventive concept, the encapsulating or filling composition may further include a second curable material.

In an exemplary embodiment of the present inventive concept, the second curable material may include at least one of a di(meth)acrylate compound represented by Formula 2-1 and an aliphatic or aromatic (meth)acrylate compound represented by Formula 2-2:

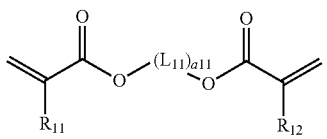

Formula 2-1

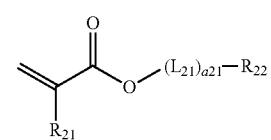

Formula 2-2 wherein, in Formulae 2-1 and 2-2, $L_{11}$ and $L_{21}$ may each independently be —O—, —S—, —S(=O)$_2$—, —C(=O)—, —C(=O)O—, —C(=O)NH—, —N(R$_3$)—, —C(R$_3$)(R$_4$)—, —Si(R$_3$)(R$_4$)—, a substituted or unsubstituted $C_6$-$C_{60}$ arylene group, a substituted or unsubstituted $C_1$-$C_{60}$ heteroarylene group, or a substituted or unsubstituted $C_1$-$C_{20}$ alkylene group, a11 and a21 may each independently be an integer from 1 to 10, $R_3$ and $R_4$ may be understood by referring to the description for $R_3$ and $R_4$ provided herein, i.e., the same as described above, $R_{11}$, $R_{12}$, and $R_{21}$ may each independently be hydrogen or a methyl group, and $R_{22}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In an exemplary embodiment of the present inventive concept, the di(meth)acrylate compound may be selected from ethylene glycol di(meth)acrylate, diethylene glycol di(meth)acrylate, triethylene glycol di(meth)acrylate, propylene glycol di(meth)acrylate, dipropylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, and dipentaerythritol di(meth)acrylate.

In an exemplary embodiment of the present inventive concept, the di(meth)acrylate compound may be represented by Formula D-1:

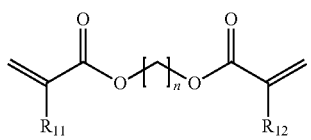

Formula D-1 wherein, in Formula D-1, $R_{11}$ and $R_{12}$ may each independently be hydrogen or a methyl group, and n1 may be an integer from 6 to 12.

In an exemplary embodiment of the present inventive concept, the aromatic (meth)acrylate compound may be represented by Formula Ar-1:

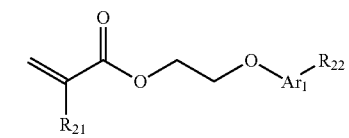

Formula Ar-1 wherein, in Formula Ar-1, $R_{21}$ may be hydrogen or a methyl group, $Ar_1$ may be selected from a substituted or unsubstituted $C_6$-$C_{60}$ arylene group and a substituted or unsubstituted $C_1$-$C_{60}$ heteroarylene group, and $R_{22}$ may be understood by referring to the description for $R_{22}$ provided herein.

In an exemplary embodiment of the present inventive concept, $R_{22}$ may be hydrogen or a methyl group.

In an exemplary embodiment of the present inventive concept, the aromatic (meth)acrylate compound may be selected from Compounds 3-1 to 3-3:

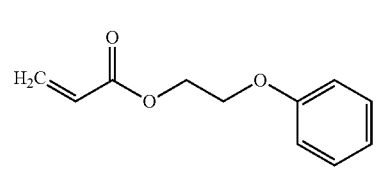

Compound 3-1

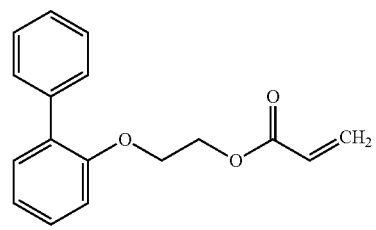

Compound 3-2

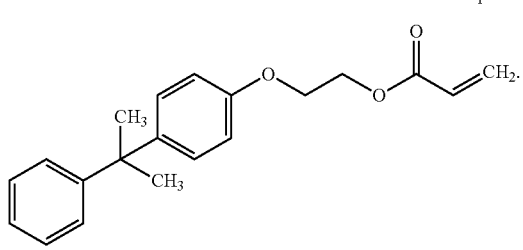

Compound 3-3

In an exemplary embodiment of the present inventive concept, a content of the second curable material may be in a range from about 40 parts to about 99 parts by weight, based on 100 parts by weight of the encapsulating or filling composition.

In an exemplary embodiment of the present inventive concept, the first curable material may be a monomer containing an epoxy group and a (meth)acrylate group, and the polymerization initiator may be a photoinitiator. For example, the polymerization initiator may be a radical photoinitiator which generates radicals upon exposure of a light, for example, an ultraviolet (UV) light, to initiate radical polymerization of the monomers containing the (meth)acrylate group.

In an exemplary embodiment of the present inventive concept, the first curable material may be a monomer containing an epoxy group and a (meth)acrylate group, and a viscosity of the encapsulating or filling composition may be in a range from about 1 centipoise (cPs) to about 10,000 cPs.

In an exemplary embodiment of the present inventive concept, the first curable material may be a monomer containing an epoxy group and a (meth)acrylate group, and a surface tension of the encapsulating or filling composition may be in a range from about 20 milli-Newton per meter (mN/m) to about 50 mN/m.

The photoinitiator may be any suitable photoinitiator available in the art. In an exemplary embodiment of the present inventive concept, the photoinitiator may be curable by exposing to a light in a wavelength range from about 360 nanometers (nm) to about 400 nm.

The photoinitiator may be, for example, an oxime compound, an acetophenone compound, a thioxanthone compound, a benzophenone compound, a phosphine oxide compound, or any combination thereof, but the present inventive concept is not limited thereto. For example, in an exemplary embodiment of the present inventive concept, a benzoin compound, a triazine compound, a diazo compound, a carbazole compound, a biimidazole compound, a diketone compound, or a sulfonium borate compound may also be used as the photoinitiator for the polymerization of the monomer containing an epoxy group and a (meth)acrylate group.

The oxime compound may include 1,2-octanedione, 2-di-methylamino-2-(4-methylbenzyl)-1-(4-morpholin-4-yl-phenyl)-butan-1-one, 1-(4-phenylsulfanylphenyl)-butane-1,2-dione-2-oxime-O-benzoate, 1-(4-phenylsulfanylphenyl)-octane-1,2-dione-2-oxime-O-benzoate, 1-(4-phenylsulfanylphenyl)-octan-1-one-oxime-O-acetate, 1-(4-phenylsulfanylphenyl)-butan-1-one-2-oxime-O-acetate, 2-(0-benzoyloxime)-1-[4-(phenylthio)phenyl]-1,2-octane-dione, 1-(0-acetyloxime)-1-[9-ethyl-6-(2-methylbenzoyl)-9H-carbazol-3-yl]ethanone, 0-ethoxycarbonyl-α-oxyamino-1-phenylpropan-1-one, or any combination thereof.

The acetophenone compound may include 4-phenoxy dichloroacetophenone, 4-t-butyl dichloroacetophenone, 4-t-butyl trichloroacetophenone, 2,2-diethoxyacetophenone, 2-hydroxy-2-methyl-1-phenyl-propan-1-one, 1-(4-isopropylphenyl)-2-hydroxy-2-methyl-propan-1-one, 1-(4-dodecylphenyl)-2-hydroxy-2-methylpropan-1-one, 4-(2-hydroxyethoxy)-phenyl-(2-hydroxy-2-propyl)ketone, 1-hydroxy cyclohexyl phenyl ketone, 2-methyl-1-[4-(methylthio)phenyl]-2-morpholino-propan-1-one, or any combination thereof.

The thioxanthone compound may include thioxanthone, 2-chlorothioxanthone, 2-methylthioxanthone, isopropyl thioxanthone, 2,4-diethyl thioxanthone and 2,4-diisopropyl thioxanthone, or any combination thereof.

The benzophenone compound may include benzophenone, benzoyl benzoate, benzoyl benzoate methyl ester, 4-phenyl benzophenone, hydroxy benzophenone, 4-benzoyl-4'-methyl diphenyl sulfide, 3,3'-dimethyl-4-methoxy benzophenone, or any combination thereof.

The phosphine oxide compound may include (2,4,6-trimethylbenzoyl) diphenylphosphine oxide, phenylbis(2,4,6-trimethylbenzoyl)phosphine oxide, or any combination thereof.

In an exemplary embodiment of the present inventive concept, a content of the photoinitiator may be in a range from about 0.01 parts to about 10 parts by weight, for example, from about 1 part to about 5 parts by weight, based on 100 parts by weight of the encapsulating or filling composition.

In an exemplary embodiment of the present inventive concept, the first curable material may be an oligomer including an epoxy group.

In an exemplary embodiment of the present inventive concept, the first curable material may include at least one selected from a bisphenol A glycidyl ether resin, a bisphenol F glycidyl ether resin, a novolac epoxy resin, an aliphatic glycidyl ether, a cycloaliphatic epoxy resin, and a brominated epoxy resin.

In an exemplary embodiment of the present inventive concept, the first curable material may include polymeric epoxy resins which may be aliphatic, cycloaliphatic, aromatic, or heterocyclic epoxy resins. The polymeric epoxy resins may include linear polymers each having an epoxy group as a terminal group, an oxirane unit within the polymer backbone, and/or an epoxy group as a pendant side group.

In an exemplary embodiment of the present inventive concept, the first curable material may include a polymeric epoxy resin, and the polymerization initiator may be a thermal initiator.

In an exemplary embodiment of the present inventive concept, the first curable material may be an oligomer represented by one of Compounds 10-1 to 10-8:

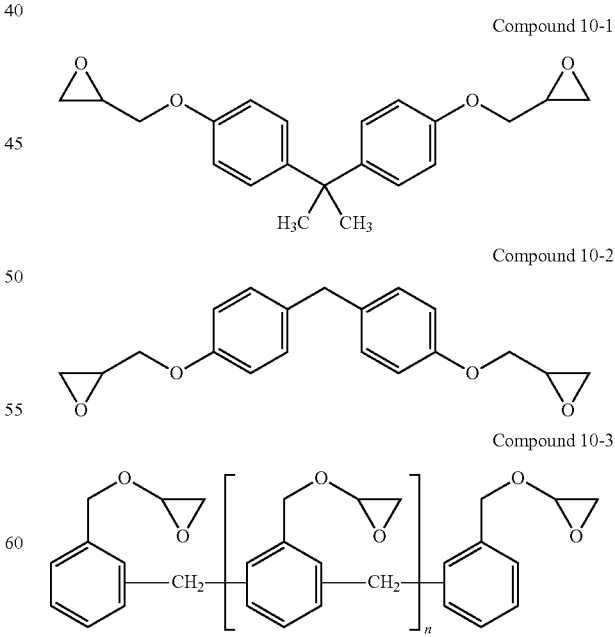

(wherein, n may be an integer, for example, n may be an integer from 1 to 100,000)

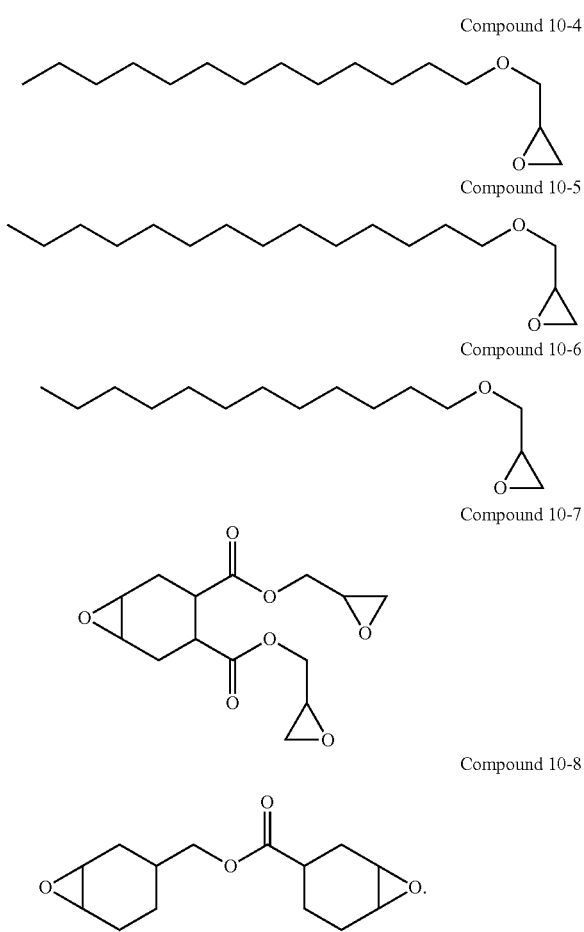

Compound 10-4

Compound 10-5

Compound 10-6

Compound 10-7

Compound 10-8

In an exemplary embodiment of the present inventive concept, the first curable material may be an oligomer including an epoxy group, and the polymerization initiator may be a thermal initiator.

In an exemplary embodiment of the present inventive concept, the first curable material may include at least one selected from a bisphenol A glycidyl ether resin, a bisphenol F glycidyl ether resin, a novolac epoxy resin, an aliphatic glycidyl ether, a cycloaliphatic epoxy resin, and a brominated epoxy resin, and the polymerization initiator may be a thermal initiator.

The thermal initiator may be, for example, a persulfate-based initiator, an azo-based initiator, hydrogen peroxide, ascorbic acid, or any combination thereof, but the present inventive concept is not limited thereto.

The persulfate-based initiator may include sodium persulfate ($Na_2S_2O_8$), potassium persulfate ($K_2S_2O_8$), ammonium persulfate ($(NH_4)_2S_2O_8$), or any combination thereof. The azo-based initiator may include 2,2-azobis(2-amidinopropane) dihydrochloride, 2,2-azobis N-dimethylene isobutyramidine dihydrochloride, 2-(carbamoylazo)isobutylonitrile, 2,2-azobis[2-(2-imidazolin-2-yl)propane] dihydrochloride, 4,4-azobis-(4-cyanovaleric acid), or any combination thereof.

In an exemplary embodiment of the present inventive concept, a content of the thermal initiator may be in a range from about 0.001 parts to about 10 parts by weight, for example, from about 0.1 parts to about 5 parts by weight, based on 100 parts by weight of the encapsulating or filling composition.

In an exemplary embodiment of the present inventive concept, the encapsulating or filling composition may further include at least one of a thermal stabilizer, a curing agent, or a photoacid generator.

In an exemplary embodiment of the present inventive concept, the encapsulating or filling composition may further include a thermal stabilizer, and the thermal stabilizer may be an organic tin-based thermal stabilizer, a Ca—Zn-based thermal stabilizer, a hydrotalcite-based thermal stabilizer, a phosphorous (P)-based thermal stabilizer/an oxidation inhibitor, or the like.

In an exemplary embodiment of the present inventive concept, the encapsulating or filling composition may further include a curing agent, and the curing agent may include, for example, an aromatic or aliphatic amine, an amide, a polyamide, an acid anhydride, or the like.

In an exemplary embodiment of the present inventive concept, the encapsulating or filling composition may further include a photoacid generator, and the photoacid generator may include, for example, triphenyl sulfonium nonaflate (TPSN), (trifluoro-methylsulfonyloxy)-bicyclo[2.2.1]hept-5-ene-2,3-dicarboximide (MDT), N-hydroxynaphthalimide dodecane sulfonate (DDSN), onium salts, aromatic diazonium salts, sulfonium salts, diaryliodonium salts, Sulfonic acid esters of N-hydroxyamides, imides, or combinations thereof.

In an exemplary embodiment of the present inventive concept, the first curable material may be an oligomer including an epoxy group, and a viscosity of the encapsulating or filling composition may be in a range from about 1 cPs to about 10,000 cPs, for example, from about 10 cPs to about 5,000 cPs.

In an exemplary embodiment of the present inventive concept, the first curable material may be an oligomer including an epoxy group, and a surface tension of the encapsulating or filling composition may be in a range from about 10 mN/m to about 100 mN/m, for example, from about 30 mN/m to about 50 mN/m.

In an exemplary embodiment of the present inventive concept, the metal catalyst may be a metal-salen complex represented by Formula 3:

Formula 3

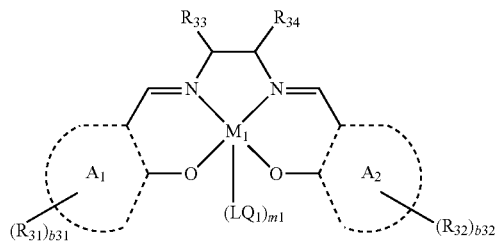

wherein, in Formula 3, $M_1$ may be a metal atom, $A_1$ and $A_2$ may each independently be a benzene group, a naphthalene group, a pyridine group, a thiophene group, or a pyrrole group, $R_{31}$ to $R_{34}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{31}$ to $R_{34}$ may optionally be bound to form a substituted or unsubstituted ring, b31 and b32 may each independently be an integer from 0 to 6, $LQ_1$ may be a monovalent organic ligand or monovalent inorganic ligand, and m1 may be an integer from 0 to 2.

In an exemplary embodiment of the present inventive concept, $M_1$ may be manganese (Mn), cobalt (Co), titanium (Ti), chromium (Cr), ruthenium (Ru), or aluminum (Al). For example, in an exemplary embodiment of the present inventive concept, $M_1$ may be manganese (Mn) or cobalt (Co). In general, a metal-salen complex is a coordination compound between a metal cation and a ligand derived from N,N'-bis (salicylidene)ethylenediamine, commonly called salen. When the metal of the metal-salen complex is manganese (Mn), the metal-salen complex is usually denoted as Mn(salen), and when the metal of the metal-salen complex is Cobalt (Co), the metal-salen complex is usually denoted as Co(salen). The cobalt (Co) cation may be divalent $Co^{2+}$, or trivalent $Co^{3+}$, such that the metal-salen complex may be Co(II)(salen) or Co(III)(salen). Salen may be substituted to enhance solubility, for example, side groups may be attached to the ethylene bridge or the benzene rings of salen to enhance solubility. Also, the benzene rings of the typical metal-salen complex may be replaced with other aromatic groups, such as, for example, naphthalene, pyridine, thiophene, furan and pyrrole. For example, in an exemplary embodiment of the present inventive concept, $A_1$ and $A_2$ in Formula 3 may each independently be a benzene group, a naphthalene group, a pyridine group, a thiophene group, a furan group, or a pyrrole group. Thus, the analogs of Mn(salen) and Co(salen) may include compounds with Mn(salen) and Co(salen) having their benzene rings replaced with other aromatic groups. In an exemplary embodiment of the present inventive concept, the metal catalyst of the encapsulating or filling composition may include a substituted Mn(salen), a substituted Co(salen), a substituted Ti(salen), a substituted Cr(salen), a substituted Ru(salen), a substituted Al(salen), or an analog thereof.

In an exemplary embodiment of the present inventive concept, $R_{31}$ to $R_{34}$ may be selected from hydrogen, deuterium, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group and a biphenyl group; and a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, and a biphenyl group, each substituted with at least one selected from deuterium, —F, —Cl, —Br, —I, a hydroxyl group, a cyano group, an epoxy group, a nitro group, an amidino group, a hydrazino group, a hydrazono group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, and a biphenyl group.

In an exemplary embodiment of the present inventive concept, $R_{33}$ and $R_{34}$ may optionally be bound to form a substituted or unsubstituted ring.

The metal catalyst may catalyze hydration reaction of an epoxy group included in the first curable material with water ($H_2O$) in the encapsulating or filling composition, thus enhancing hygroscopicity of the encapsulating or filling composition.

In an exemplary embodiment of the present inventive concept, the metal catalyst may be selected from Compounds M-1 to M-4:

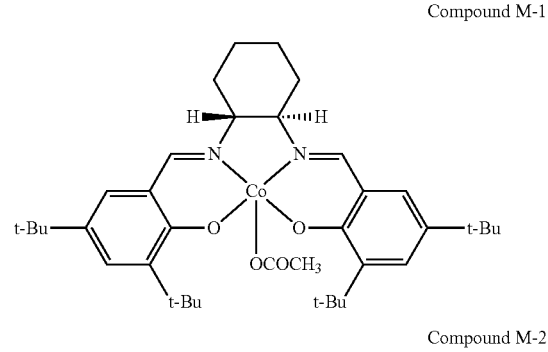

Compound M-1

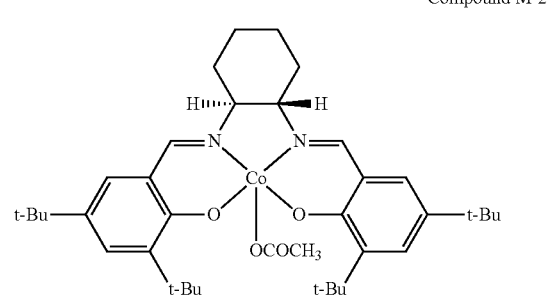

Compound M-2

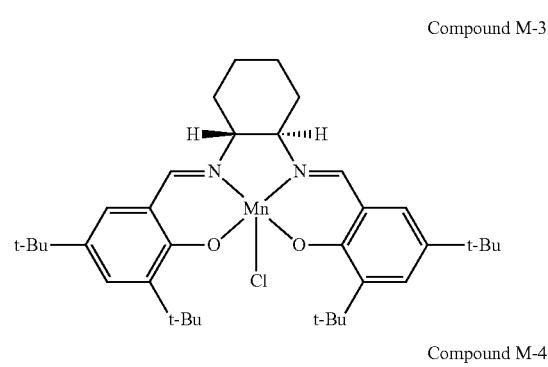

Compound M-3

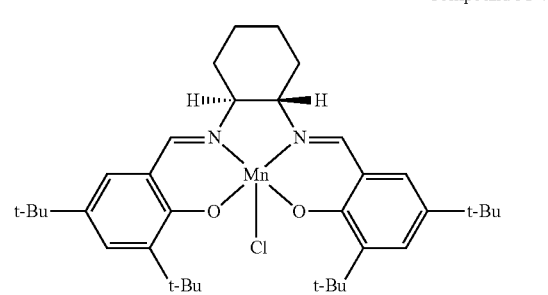

Compound M-4 wherein, in Compounds M-1 to M-4, "t-Bu" represents a t-butyl group.

Compound M-1 and Compound M-2 are enantiomers, and Compound M-3 and Compound M-4 are enantiomers.

In an exemplary embodiment of the present inventive concept, a content of the metal catalyst may be in a range from about 0.1 parts to about 10 parts by weight, for example, from about 1 part to about 5 parts by weight, based on 100 parts by weight of the encapsulating or filling composition. When the content of the metal catalyst is within any of these ranges, an electronic apparatus including the encapsulating or filling composition may exhibit enhanced water removal performance in an encapsulating member or filling member, thereby enhancing durability of the encapsulating member or filling member. When, the content of the metal catalyst is less than about 0.1 parts by weight, the water may not be sufficiently removed due to insufficient metal catalyst present in the encapsulating or filling composition to catalyze the chemical reaction between the epoxy group and water ($H_2O$).

[Electronic Apparatus]

According to an exemplary embodiment of the present inventive concept, an electronic apparatus may include: a first substrate; an electronic device disposed on the first substrate; and one or more cured materials of the encapsulating or filling composition formed on the electronic device.

In an exemplary embodiment of the present inventive concept, the electronic apparatus may further include an encapsulating member that encapsulating the electronic device. In an exemplary embodiment of the present inventive concept, the encapsulating member may include a cured material of the encapsulating or filling composition.

In an exemplary embodiment of the present inventive concept, the encapsulating member may include a thin film encapsulation unit including an organic film.

In an exemplary embodiment of the present inventive concept, the film encapsulation unit may include a cured material of the encapsulating or filling composition. In an exemplary embodiment of the present inventive concept, the organic film may include a cured material of the encapsulating or filling composition.

In an exemplary embodiment of the present inventive concept, the electronic apparatus may include: a first substrate; an electronic device included in a pixel determination area on the first substrate; and a film encapsulation unit including an organic film, the film encapsulation unit encapsulating the electronic device, in which the organic film may include a cured material of the encapsulating or filling composition.

Hereinafter, referring to FIGS. 1 to 3, an electronic apparatus including a cured material of the encapsulating or filling composition in an encapsulating member will be described.

As shown in FIG. 1, an electronic apparatus 10 according to an exemplary embodiment of the present inventive concept includes a first substrate 100, an electronic device 200 such as an organic light-emitting device, and an encapsulating member 300.

In an exemplary embodiment of the present inventive concept, the encapsulating member 300 may include a film encapsulation unit including an organic film, and the organic film may include a cured material of the encapsulating or filling composition.

The first substrate 100 may be any substrate that is used in typical electronic apparatuses and may be an inorganic substrate or an organic substrate with high mechanical strength, thermal stability, transparency, surface smoothness, ease of handling, and water resistance.

In an exemplary embodiment of the present inventive concept, the first substrate 100 may be an inorganic substrate including a transparent glass material which includes silicon oxide ($SiO_2$), but the present inventive concept is not limited thereto.

In an exemplary embodiment of the present inventive concept, the first substrate 100 may be an insulating organic material. The insulating organic material may be selected from, for example, polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), and cellulose acetate propionate (CAP), but the present inventive is not limited thereto.

The electronic device 200 may be disposed on the first substrate 100. The electronic device 200 may include: a first electrode; an interlayer including an emission layer; and a second electrode. The interlayer is disposed between the first electrode and the second electrode. The electronic device 200 may be understood by referring to the descriptions for those provided herein.

The encapsulating member 300 including an organic film may be formed on the electronic device 200.

In an exemplary embodiment of the present inventive concept, the encapsulating member 300 may include a cured material of the encapsulating or filling composition. In this exemplary embodiment, the encapsulating member 300 may be prevented from being deteriorated due to outgassing or swelling and may exhibit enhanced water removal performance, thus enabling simplification of a structure of an encapsulating member and a manufacturing process thereof.

In an exemplary embodiment of the present inventive concept, the encapsulating member 300 may include a film encapsulation unit including an organic film.

In an exemplary embodiment of the present inventive concept, the organic film may include a cured material of the encapsulating or filling composition.

In an exemplary embodiment of the present inventive concept, the film encapsulation unit may further include a matrix resin, and a cured material of the encapsulating or filling composition may be dispersed in the matrix resin. In this exemplary embodiment, a cured material of the encapsulating or filling composition may be simply dispersed in the matrix resin. In an exemplary embodiment of the present inventive concept, a cured material of the encapsulating or filling composition may be cross-linked with the matrix resin.

In an exemplary embodiment of the present inventive concept, the first curable material in the encapsulating or filling composition includes a (meth)acrylate monomer including the epoxy group, and the (meth)acrylate monomer including the epoxy group includes a polymeric functional group, and thus, the first curable material may be cross-linked with the matrix resin.

In an exemplary embodiment of the present inventive concept, an organic film in the film encapsulation unit may further include a photoinitiator. For example, the encapsulating or filling composition may include the photoinitiator. The photoinitiator may be understood by referring to the descriptions of the photoinitiator provided herein.

The organic film may be formed in a specific region by using various methods, such as, for example, vacuum-deposition, spin coating, casting, Langmuir-Blodgett (LB) deposition, inkjet printing, laser-printing, laser induced thermal imaging (LITI), one drop filling (ODF), dispensing, or the like. The number and thickness of the organic film may be appropriately selected depending on the productivity or device characteristics.

In an exemplary embodiment of the present inventive concept, the film encapsulation unit may further include, for example, metal, metal halide, metal nitride, metal oxide, metal oxynitride, silicon nitride ($Si_3N_4$), silicon oxide ($SiO_2$), and/or silicon oxynitride (SiON).

In an exemplary embodiment of the present inventive concept, the film encapsulation unit may further include an inorganic film, and the inorganic film may include, for example, metal, metal halide, metal nitride, metal oxide, metal oxynitride, silicon nitride ($Si_3N_4$), silicon oxide ($SiO_2$), and/or silicon oxynitride (SiON).

In an exemplary embodiment of the present inventive concept, an inorganic film in the film encapsulation unit may include at least one of, for example, magnesium fluoride ($MgF_2$), lithium fluoride (LiF), aluminum fluoride ($AlF_3$), sodium fluoride (NaF), silicon oxide ($SiO_2$), silicon nitride ($Si_3N_4$), silicon oxynitride (SiON), aluminum oxide ($Al_2O_3$), aluminum nitride (AlN), aluminum oxynitride (AlON), titanium oxide ($TiO_2$), titanium nitride (TiN), tantalum oxide ($Ta_2O_5$), tantalum nitride (TaN), hafnium oxide ($HfO_2$), hafnium nitride _(HfN), zirconium oxide ($ZrO_2$), zirconium nitride (ZrN), cerium oxide ($CeO_2$), cerium nitride (CeN), tin oxide (SnO), tin nitride ($Sn_3N_2$), or magnesium oxide (MgO).

The inorganic film may be formed in a specific region by using various methods, such as, for example, chemical vapor deposition (CVD), plasma enhanced chemical vapor deposition (PECVD), sputtering, atomic layer deposition (ALD), or thermal evaporation. The number and thickness of the inorganic film may be appropriately selected depending on the productivity or device characteristics.

In an exemplary embodiment of the present inventive concept, the film encapsulation unit may include a first organic film and a first inorganic film, and the first inorganic film may be formed between the electronic device 200 and the first organic film. In an exemplary embodiment of the present inventive concept, the first inorganic film and the first organic film may be sequentially stacked on the electronic device 200. In this exemplary embodiment, "being sequentially stacked" is not construed as excluding a case where another film is present between the electronic device 200 and the first inorganic film and/or between the first organic film and the first inorganic film.

In an exemplary embodiment of the present inventive concept, the film encapsulation unit may include a first organic film and a first inorganic film, and the first organic film may be formed between the electronic device 200 and the first inorganic film. In an exemplary embodiment of the present inventive concept, the first organic film and the first inorganic film may be sequentially stacked on the electronic device 200. In this exemplary embodiment, "being sequentially stacked" is not construed as excluding a case where another film is present between the electronic device 200 and the first organic film and/or between the first organic film and the first inorganic film.

In an exemplary embodiment of the present inventive concept, the film encapsulation unit may include a first organic film, a first inorganic film, and a second inorganic film, and the first inorganic film, the first organic film, and the second inorganic film may be sequentially stacked on the electronic device 200.

In an exemplary embodiment of the present inventive concept, the film encapsulation unit may include a first organic film, a first inorganic film, and a second inorganic film, and the first organic film, the first inorganic film, and the second inorganic film may be sequentially stacked on the electronic device 200.

In an exemplary embodiment of the present inventive concept, the film encapsulation unit may include a first organic film, a second organic film, a first inorganic film, and a second inorganic film, and the first inorganic film, the first organic film, the second inorganic film, and the second organic film may be sequentially stacked on the electronic device 200.

In an exemplary embodiment of the present inventive concept, the film encapsulation unit may include a first organic film, a second organic film, a first inorganic film, and a second inorganic film, and the first organic film, the first inorganic film, the second organic film, and the second inorganic film may be sequentially stacked on the electronic device 200.

In an exemplary embodiment of the present inventive concept, the film encapsulation unit may include a first organic film, a second organic film, a first inorganic film, and a second inorganic film, and the first inorganic film, the second inorganic film, the first organic film, and the second organic film may be sequentially stacked on the electronic device 200.

In an exemplary embodiment of the present inventive concept, the film encapsulation unit may include a first organic film, a second organic film, a first inorganic film, and a second inorganic film, and the first organic film, the second organic film, the first inorganic film, and the second inorganic film may be sequentially stacked on the electronic device 200.

In an exemplary embodiment of the present inventive concept, the film encapsulation unit may include a first organic film, a second organic film, a first inorganic film, a second inorganic film, and a third inorganic film, and the first inorganic film, the first organic film, the second inorganic film, the second organic film, and the third inorganic film may be sequentially stacked on the electronic device 200.

In an exemplary embodiment of the present inventive concept, the film encapsulation unit may include a first organic film, a second organic film, a first inorganic film, a second inorganic film, and a third inorganic film, and the first organic film, the first inorganic film, the second organic film, the second inorganic film, and the third inorganic film may be sequentially stacked on the electronic device 200.

The stacking structures of the film encapsulation unit described above are examples, and the present inventive concept is not limited thereto. The stacking order of inorganic films and organic films as well as the number of organic films and inorganic films may vary depending on the design thereof.

The first organic film and the second organic film may each be understood by referring to the description of the organic film provided herein, and the first inorganic film, the second inorganic film, and the third inorganic film may each be understood by referring to the description of the inorganic film provided herein.

The electronic apparatus 10 may include a plurality of electronic devices 200. Accordingly, in an exemplary embodiment of the present inventive concept, the electronic apparatus 10 may include the first substrate 100, an emission unit including a plurality of the electronic devices 200 disposed on the first substrate 100, and a cured material of the encapsulating or filling composition formed on the plurality of the electronic devices 200.

In an exemplary embodiment of the present inventive concept, the electronic apparatus 10 may include the encapsulating member 300 formed on the emission unit and encapsulating the emission unit, and the encapsulating member 300 may include a cured material of the encapsulating or filling composition.

In an exemplary embodiment of the present inventive concept, the encapsulating member 300 may include a film encapsulation unit including an organic film, and the organic film may include a cured material of the encapsulating or filling composition.

According to an exemplary embodiment of the present inventive concept, a method of manufacturing an electronic apparatus may include: forming an electronic device on a first substrate; and forming an encapsulating member encapsulating the electronic device on the first substrate.

The forming of the encapsulating member may include providing the encapsulating or filling composition over the electronic device on the first substrate and curing the encapsulating or filling composition to cover the electronic device.

The curing of the encapsulating or filling composition may include exposing the encapsulating or filling composition to an ultraviolet (UV) light with a wavelength in a range from about 360 nm to about 400 nm.

The first substrate, the electronic device, the encapsulating member, the organic film, the film encapsulation unit, and the encapsulating or filling composition may respectively be understood by referring to the descriptions of the first substrate, the electronic device, the encapsulating member, the organic film, the film encapsulation unit, and the encapsulating or filling composition provided herein.

The encapsulating or filling composition may remove water, as the first curable material may include an epoxy group, and the metal catalyst may catalyze a chemical reaction between the epoxy group and water ($H_2O$). When an electronic apparatus is manufactured according to the method described above, the encapsulating member may be prevented from being deteriorated due to outgassing or swelling of the film encapsulation unit and may exhibit enhanced water removal performance, thus enabling simplification of a structure of an encapsulating member and a manufacturing process thereof.

Figure 2:
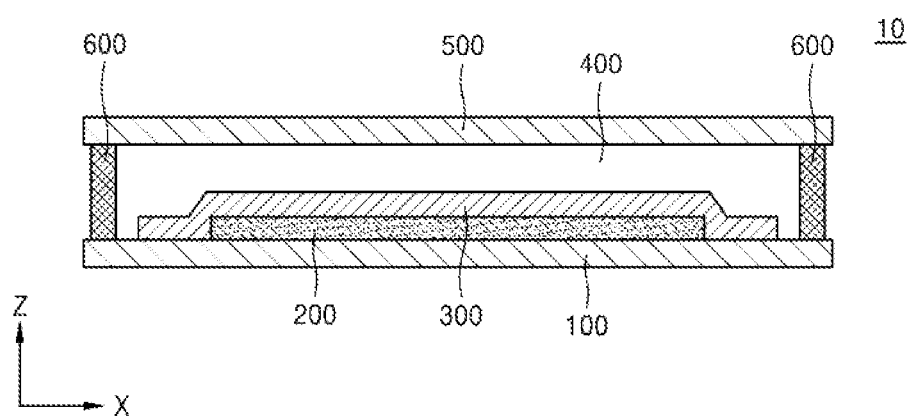
FIG. 2 is a schematic cross-sectional view of an electronic apparatus according to an exemplary embodiment of the present inventive concept.
Figure 3:
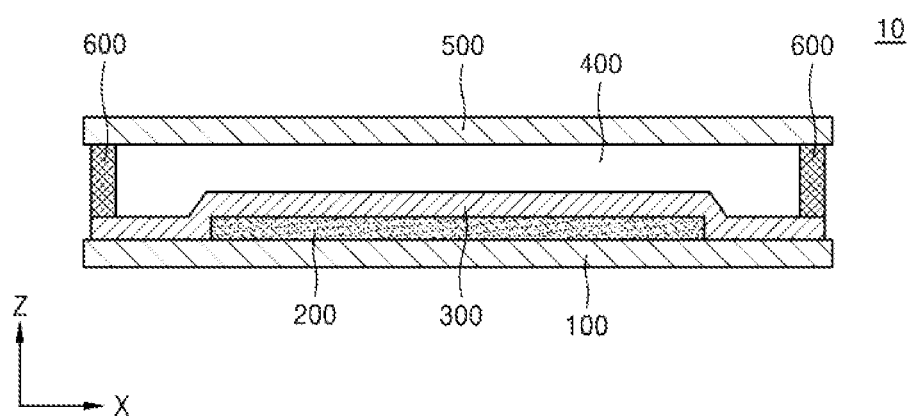
FIG. 3 is a schematic cross-sectional view of an electronic apparatus according to an exemplary embodiment of the present inventive concept.

In an exemplary embodiment of the present inventive concept, as shown in FIGS. 2 and 3, the electronic apparatus 10 according to an exemplary embodiment of the present inventive concept may include the first substrate 100, the electronic device 200, the encapsulating member 300 encapsulating the electronic device 200, a second substrate 500 disposed on the encapsulating member 300, and a filling member 400 formed between the encapsulating member 300 and the second substrate 500.

In an exemplary embodiment of the present inventive concept, the filling member 400 may include a cured material of the encapsulating or filling composition.

The electronic apparatus 10 according to an exemplary embodiment of the present inventive concept may further include a sealing member 600. The sealing member 600 may fix the first substrate 100 to the second substrate 500 by bonding and protect the electronic apparatus 10 from external environments. In an exemplary embodiment of the present inventive concept, as shown in FIG. 2, the sealing member 600 may be in direct contact with the first substrate 100 and the second substrate 500. In an exemplary embodiment of the present inventive concept, as shown in FIG. 3, the sealing member 600 may be in direct contact with the second substrate 500 and the encapsulating member 300 covering the first substrate 100 and the electronic device 200.

The sealing member 600 may include a sealant, and the sealant may contain a heat-curable or photocurable resin. Alternatively, the sealant of the sealing member 600 may be an inorganic material, for example, frit, and the frit may include a crystalized (fully and/or partially crystallized) base or mother glass.

In an exemplary embodiment of the present inventive concept, the sealant may contain an epoxy resin including, for example, a bisphenol A epoxy resin, a bisphenol F epoxy resin, an aromatic epoxy resin, a hydrogenated bisphenol epoxy resin, a cycloaliphatic epoxy resin, a novolac epoxy resin, a dicyclopentadiene epoxy resin, or any combination thereof.

The sealant may further include a heat curing agent, a photoinitiator, a coupling agent, a curing accelerator, an inorganic filler, an antioxidant, and a spacer.

The sealant may couple the second substrate 500 with the first substrate 100 or the encapsulation member 300 and thus may function to prevent, for example, oxygen, moisture, or the like from entering the electronic device 200 and to increase the strength of the electronic apparatus 10.

In electronic apparatuses in the related art, the filling member has been simply used to impart adhesiveness between the first substrate and the second substrate.

An electronic apparatus 10 according to an exemplary embodiment of the present inventive concept includes a cured material of the encapsulating or filling composition in the filling member 400 and impart adhesiveness between the first substrate 100 and the second substrate 500. In addition, the filling member 400 may be prevented from being deteriorated due to outgassing or swelling and may exhibit enhanced durability and enhanced water removal performance, thus enabling simplification of a structure of a filling member and a manufacturing process thereof.

In an exemplary embodiment of the present inventive concept, for a cured material of the encapsulating or filling composition included in the filling member, the first curable material of the encapsulating or filling composition may be the oligomer including an epoxy group.

In an exemplary embodiment of the present inventive concept, in a cured material of the encapsulating or filling composition included in the filling member 400, the polymerization initiator may be a thermal initiator and may further include at least one of a thermal stabilizer, a curing agent, or a photo acid generator.

In an exemplary embodiment of the present inventive concept, a cured material of the encapsulating or filling composition included in the filling member 400 may be cured at a temperature in a range from about 60° C. to about 120° C., for example, from about 80° C. to about 100° C., for about 15 minutes to about 75 minutes, for example, for about 30 minutes to about 60 minutes.

The second substrate 500 may be understood by referring to the descriptions of the first substrate 100 provided herein, and the first substrate 100 may be identical to or different from the second substrate 500 depending on the purpose thereof.

According to an exemplary embodiment of the present inventive concept, a method of manufacturing an electronic apparatus may include: forming an electronic device on a first substrate; forming an encapsulating member encapsulating the electronic device on the first substrate, the encapsulating member including a film encapsulation unit; providing an encapsulating or filling composition on a second substrate; and bonding the first substrate and the second substrate with the encapsulating or filling composition provided on the second substrate to form a filling member.

The forming of the filling member may include curing the encapsulating or filling composition.

The curing of the encapsulating or filling composition to form the filling member may include heating the encapsulating or filling composition provided on the second substrate at a temperature in a range from about 60° C. to about 120° C., for example, from about 80° C. to about 100° C., for about 15 minutes to about 75 minutes, for example, for about 30 minutes to about 60 minutes.

The first substrate, the electronic device, the encapsulating member, the organic film, the film encapsulation unit, and the encapsulating or filling composition may respectively be understood by referring to the descriptions of the first substrate, the electronic device, the encapsulating member, the organic film, the film encapsulation unit, and the encapsulating or filling composition provided herein. The encapsulating or filling composition may remove water, as the first curable material may include an epoxy group, and the metal catalyst may catalyze a chemical reaction between the epoxy group and water ($H_2O$). When an electronic apparatus is manufactured according to the method described above, the filling member may be prevented from being deteriorated due to outgassing or swelling and may exhibit enhanced water removal performance, thus enabling simplification of a structure of an filling member and a manufacturing process thereof.

The encapsulating or filling composition may be provided to a specific region on the second substrate by various methods, such as, for example, inkjet printing, jet dispensing, one drop filling (ODF), dispensing, screen printing, or gravure printing. In addition, the thickness of the filling member may be appropriately selected depending on the productivity or device characteristics.

The electronic apparatus may be applicable to display apparatuses used in, for example, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, or an endoscope display device), a fish finder, various measurement devices, gauges (e.g., gauges of an automobile, an airplane, or a ship), and/or a projector, but the present inventive concept is not limited thereto.

The electronic apparatus may further include a thin film transistor, in addition to the electronic device. In this exemplary embodiment, the thin film transistor may include a gate electrode, a source electrode, an activation layer, and a drain electrode, and the first electrode of the electronic device may be electrically connected to one of the source electrode and the drain electrode of the thin-film transistor. The gate electrode may overlap the activation layer. The portion of the activation layer overlapping the gate electrode may be the channel region of the thin film transistor. The source and drain electrodes of the thin film transistor may be located at both sides of the channel region.

[Electronic Device]

In an exemplary embodiment of the present inventive concept, the electronic device included in the electronic apparatus may be a light-emitting device. In an exemplary embodiment of the present inventive concept, the electronic device may be at least one selected from an organic light-emitting device and a quantum dot light-emitting device.

(Organic Light-Emitting Device)

In an exemplary embodiment of the present inventive concept, the electronic device may be a light-emitting device including: a first electrode; a second electrode facing the first electrode; and an interlayer formed between the first electrode and the second electrode and including an emission layer.

In an exemplary embodiment of the present inventive concept, the electronic device may be an organic light-emitting device, and an interlayer of the organic light-emitting device may include at least one emission unit including the emission layer which includes an organic material.

In an exemplary embodiment of the present inventive concept, the organic light-emitting device may include one emission unit.

In an exemplary embodiment of the present inventive concept, the organic light-emitting device may include at least two emission units.

In an exemplary embodiment of the present inventive concept, the organic light-emitting device may include emission units in the number of m (wherein m is an integer of 2 or greater), and charge generation layers in the number of m-1 between the adjacent two emission units from among the emission units in the number of m.

In an exemplary embodiment of the present inventive concept, a maximum emission wavelength emitted from at least one of the emission units in the number of m may differ from that of light emitted from at least one of the other emission units.

In an exemplary embodiment of the present inventive concept, the emission units in the number of m may emit blue light, for example, blue light having a maximum emission wavelength of about 410 nm or greater and about 490 nm or lower.

In an exemplary embodiment of the present inventive concept, the emission unit or units included in the organic light-emitting device may each emit, for example, red light, green light, or blue light, or may emit red light, green light, blue light, or white light.

(Quantum Dot Light-Emitting Device)

In an exemplary embodiment of the present inventive concept, the electronic device may be a quantum dot light-emitting device including: a first electrode; a second electrode facing the first electrode; and an interlayer formed between the first electrode and the second electrode and including an emission layer. The emission layer may include a quantum dot.

The organic light-emitting device or the quantum dot light-emitting device may respectively be understood by referring to the descriptions of the organic light-emitting device or the quantum dot light-emitting device provided herein.

In an exemplary embodiment of the present inventive concept, the electronic apparatus 10 may include a color-conversion layer formed between the filling member 400 and the second substrate 500. In this exemplary embodiment, the electronic device 200 included in the electronic apparatus 10 may be a light-emitting device.

The color-conversion layer may be designed to be disposed on at least one traveling direction of light emitted from the light-emitting device, and light emitted from the light-emitting device may pass through the color-conversion layer to thereby emit light of various wavelengths.

The encapsulating or filling composition may remove water, as the first curable material may include an epoxy group, and the metal catalyst may catalyze a chemical reaction between the epoxy group and water ($H_2O$). As the electronic apparatus includes a cured material of the encapsulating or filling composition, the encapsulating member may exhibit enhanced water removal performance, thus reducing a thickness of the encapsulating member or filling member, as compared with electronic apparatuses in the related art. Accordingly, an electronic apparatus including the color-conversion layer may exhibit enhanced color reproducibility and optical efficiency.

(First Electrode)

The first electrode may be formed by depositing or sputtering, onto a first substrate, a material for forming the first electrode. When the first electrode is an anode, the material for forming the first electrode may be selected from materials with a high work function that facilitate hole injection.

The first electrode may be a reflective electrode, a semi-transmissive electrode, or a transmissive electrode. When the first electrode is a transmissive electrode, a material for forming the first electrode 110 may include a conductive oxide, and may be selected from indium tin oxide (ITO), indium zinc oxide (IZO), tin oxide ($SnO_2$), zinc oxide (ZnO), indium oxide ($In_2O_3$), indium gallium oxide (IGO), aluminum zinc oxide (AZO), and any combinations thereof, but the present inventive concept is not limited thereto. In an exemplary embodiment of the present inventive concept, when the first electrode is a semi-transmissive electrode or a reflective electrode, as a material for forming the first electrode, at least one of, for example, magnesium (Mg), silver (Ag), aluminum (Al), platinum (Pt), palladium (Pd), gold (Au), nickel (Ni), neodymium (Nd), iridium (Ir), chromium (Cr), aluminum-lithium (Al—Li), calcium (Ca), magnesium-indium (Mg—In), magnesium-silver (Mg—Ag), or any combination thereof may be used, but the present inventive concept is not limited thereto.

The first electrode may have a single-layered structure, or a multi-layered structure including two or more layers. For example, in an exemplary embodiment of the present inventive concept, the first electrode may further include a film formed of, for example, indium tin oxide (ITO), indium zinc oxide (IZO), tin oxide ($SnO_2$), zinc oxide (ZnO), indium gallium oxide (IGO), aluminum zinc oxide (AZO), or indium oxide ($In_2O_3$) above/below the aforementioned semi-transmissive or reflective layer. For example, in an exemplary embodiment of the present inventive concept, the first electrode may have a triple-layer structure of ITO/Ag/ITO, but the present inventive concept is not limited thereto.

An interlayer including an emission layer may be disposed over the first electrode.

(Interlayer)

The term "interlayer" as used herein refers to a single layer and/or a plurality of layers disposed between the first electrode and the second electrode in a quantum dot light-emitting device or an organic light-emitting device.

The interlayer may further include a hole transport region formed between the first electrode and the emission layer and an electron transport region formed between the emission layer and the second electrode, but the present inventive concept is not limited thereto.

When the electronic device is an organic light-emitting device, the interlayer may be an organic layer. However, materials included in the "organic layer" is not limited to organic materials.

(Emission Layer in Interlayer)

When the light-emitting device is a full color light-emitting device, the emission layer may be patterned into a red emission layer, a green emission layer, and a blue emission layer, according to a sub-pixel. In an exemplary embodiment of the present inventive concept, the emission layer may include a low molecular weight or high molecular weight organic material that emits light of a certain color. In an exemplary embodiment of the present inventive concept, the emission layer may have a stacked structure. The stacked structure may include two or more layers selected from a red emission layer, a green emission layer, and a blue emission layer. The two or more layers may be in direct contact with each other. In an exemplary embodiment of the present inventive concept, the two or more layers may be separated from each other. In an exemplary embodiment of the present inventive concept, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

In an exemplary embodiment of the present inventive concept, the light-emitting device may emit blue light, for example, blue light having a maximum emission wavelength of about 410 nm or greater and about 490 nm or lower. In this exemplary embodiment, the electronic apparatus may be designed such that blue light emitted from the light-emitting device may pass through a color-conversion layer to thereby emit light of various wavelengths. For example, the color-conversion layer may convert the blue light to red light, or may convert the blue light to green light. The blue light is not converted may stay as blue light. For example, the color-conversion layer may convert a blue light with a wavelength having a peak in a range from about 410 nm to about 490 nm to a red light with a wavelength having a peak in a range from about 620 nm to about 670 nm, or to a green light with a wavelength having a peak in a range from about 520 nm to about 570 nm. However, it should be understood that the wavelengths for the blue, green, and red lights are not limited to the above examples, and may include all wavelength ranges that may be recognized in the art as blue, green, and red.

The emission layer in the organic light-emitting device may include a host and a dopant. The dopant may include at least one of a fluorescent dopant and a phosphorescent dopant.

The amount of the dopant in the emission layer may be, in general, in a range from about 0.01 parts to about 15 parts by weight based on 100 parts by weight of the host, but the present inventive concept is not limited thereto.

The thickness of the emission layer may be in a range from about 100 Å to about 1,000 Å, for example, from about 200 Å to about 600 Å. When the thickness of the emission layer is within any of these ranges, enhanced luminescence characteristics may be obtained without a substantial increase in driving voltage.

(Host in emission layer)

The host may include a compound represented by Formula 301:

Formula 301

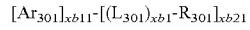

wherein, in Formula 301, $Ar_{301}$ may be selected from a substituted or unsubstituted $C_5$-$C_{60}$ carbocyclic group and a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $O_2$—$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $O_6$—$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), and xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but the present inventive concept is not limited thereto.

In an exemplary embodiment of the present inventive concept, in Formula 301, $Ar_{301}$ may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$) ($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C$ alkoxy group, a phenyl group, a biphenyl group, a terphenyl group, and a naphthyl group, but the present inventive concept is not limited thereto.

When xb11 in Formula 301 is 2 or greater, at least two $Ar_{301}$(s) may be bound via a single bond.

In an exemplary embodiment of the present inventive concept, the compound represented by Formula 301 may be represented by Formula 301-1 or 301-2:

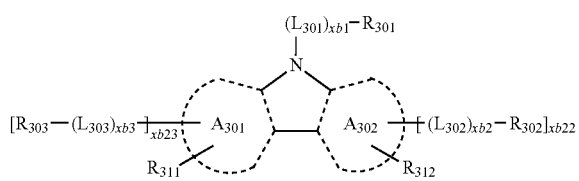

Formula 301-1

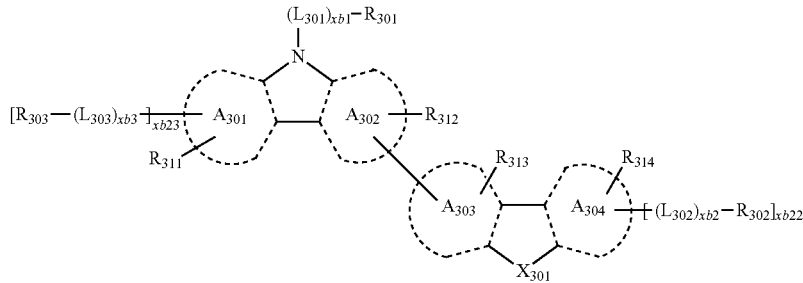

Formula 301-2 wherein, in Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonapthothiophene group, and a dinaphthothiophene group, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, and —P(=O)$(Q_{31})(Q_{32})$, xb22 and xb23 may each independently be 0, 1, or 2, $L_{301}$, xb1, $R_{301}$, and $Q_{31}$ to $Q_{33}$ may respectively be understood by referring to the descriptions of $L_{301}$, xb1, $R_{301}$, and $Q_{31}$ to $Q_{33}$ provided herein, $L_{302}$ to $L_{304}$ may each be understood by referring to the description of $L_{301}$ provided herein, xb2 to xb4 may each be understood by referring to the description of xb1 provided herein, and $R_{302}$ to $R_{304}$ may each be understood by referring to the description of $R_{301}$ provided herein.

In an exemplary embodiment of the present inventive concept, in Formulae 301, 301-1, and 301-2, $L_{301}$ to $L_{304}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, and —P(=O)$(Q_{31})(Q_{32})$, wherein $Q_{31}$ to $Q_{33}$ may respectively be understood by referring to the descriptions of $Q_{31}$ to $Q_{33}$ provided herein.

In an exemplary embodiment of the present inventive concept, in Formulae 301, 301-1, and 301-2, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may respectively be understood by referring to the descriptions of $Q_{31}$ to $Q_{33}$ provided herein.

In an exemplary embodiment of the present inventive concept, the host may include an alkaline earth metal complex. For example, the host may include a beryllium (Be) complex, e.g., Compound H55 as shown below, a magnesium (Mg) complex, or a zinc (Zn) complex.

The host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyI)-1,1'-biphenyl (CBP), 1,3-di-9-carbazolylbenzene (mCP), 1,3,5-tri(carbazol-9-yl)benzene (TCP), and Compounds H1 to H55, but the present inventive concept is not limited thereto:

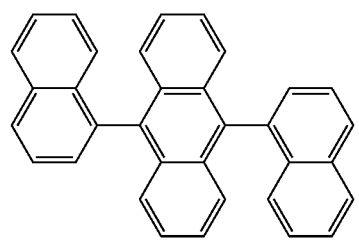

H1

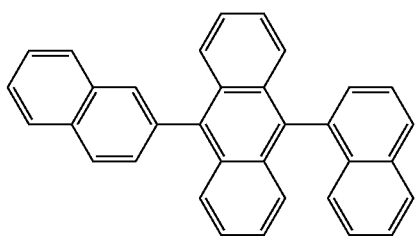

H2

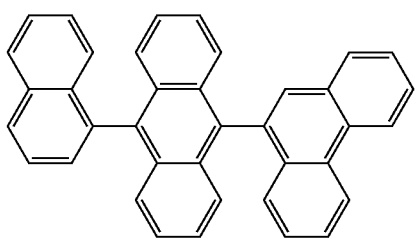

H3

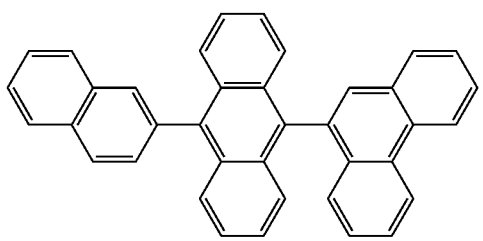

H4

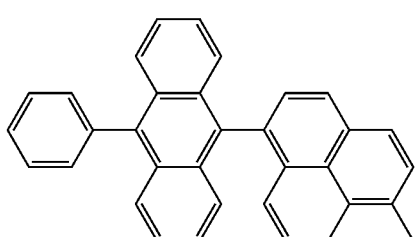

H5

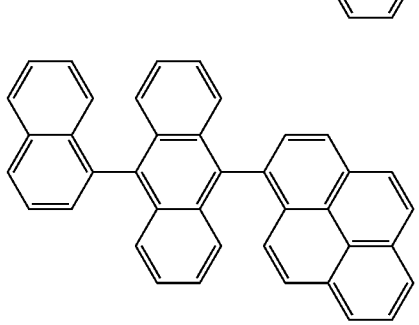

H6

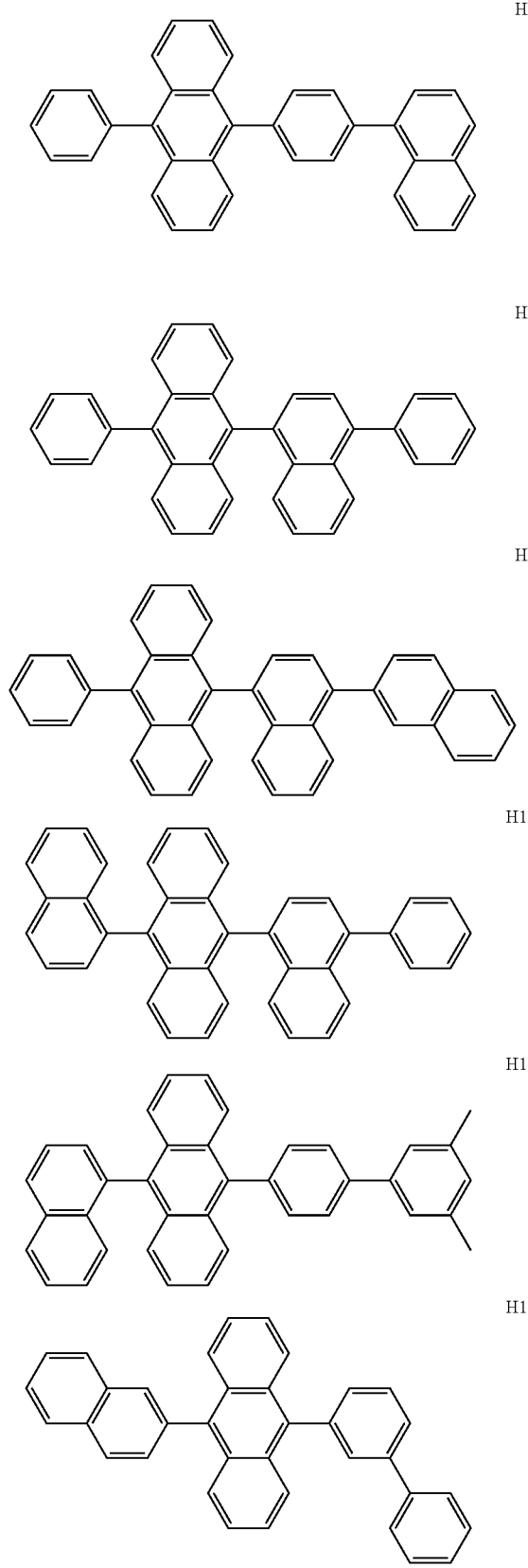

-continued
H18
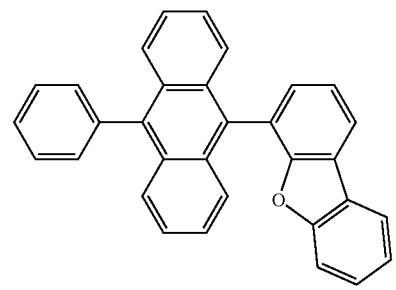
H19
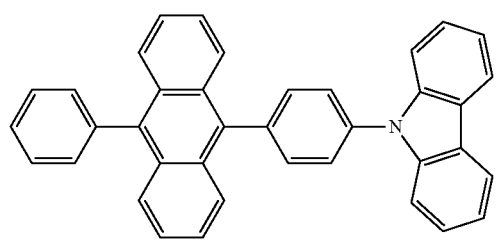
H20
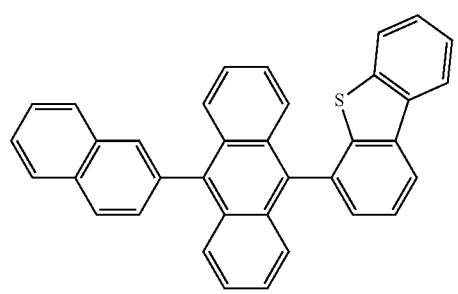
H21
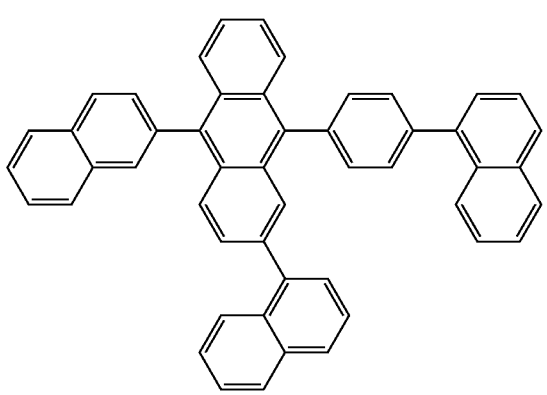
H22
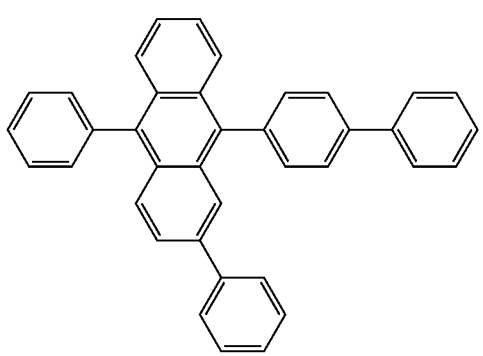
-continued
H23
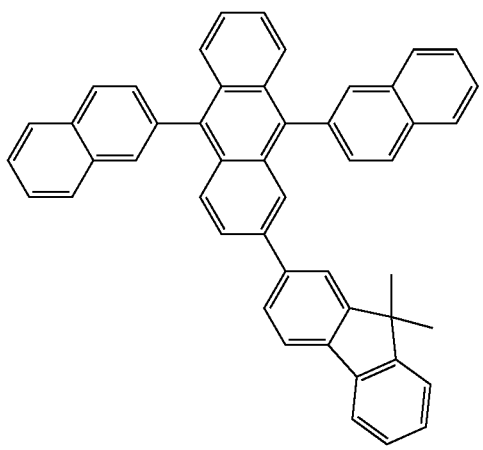
H24
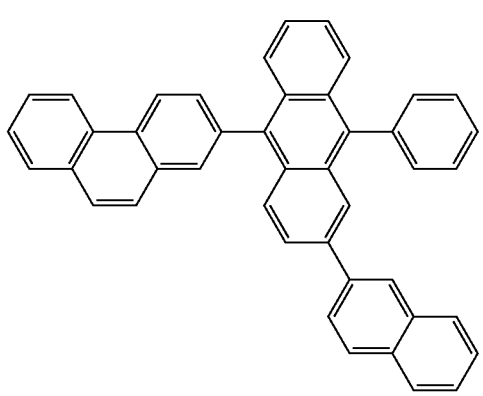
H25
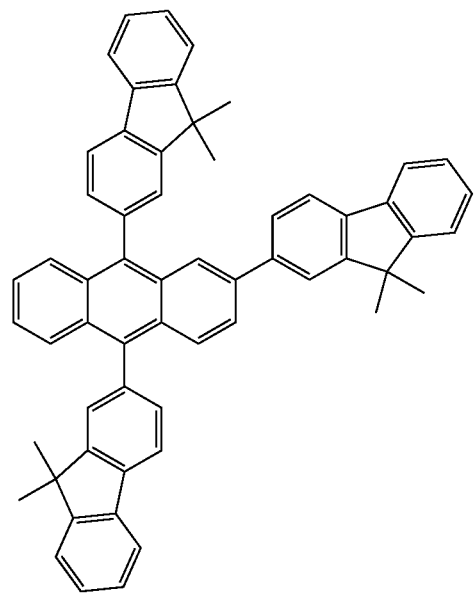

-continued
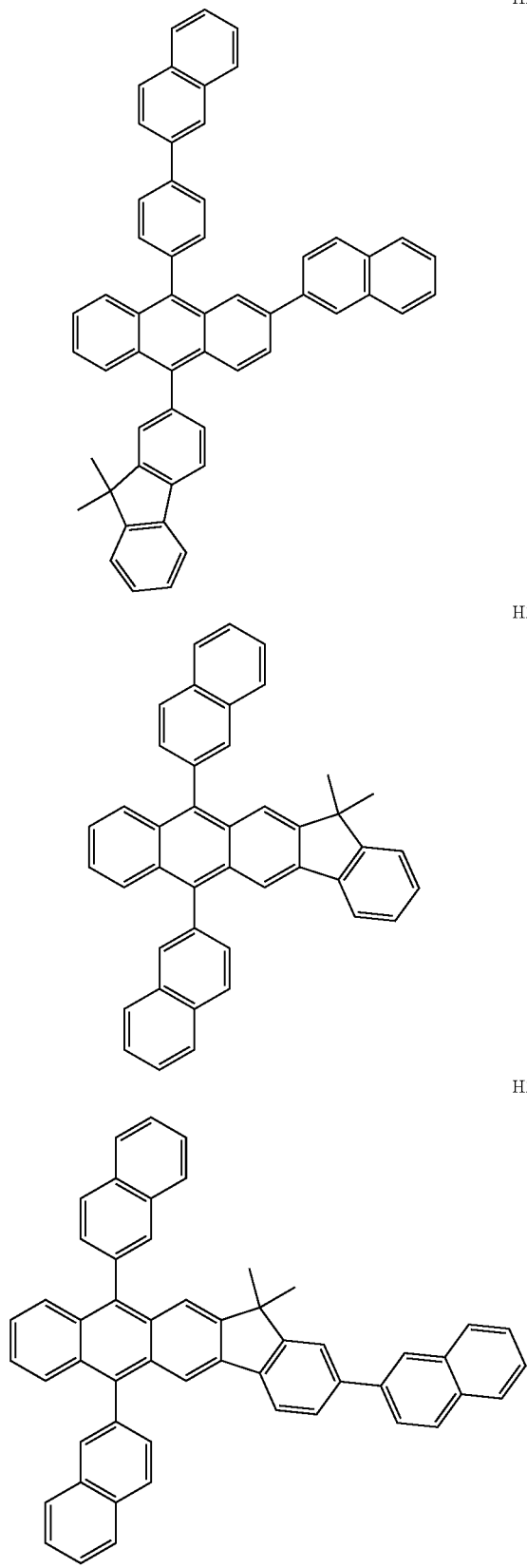
-continued
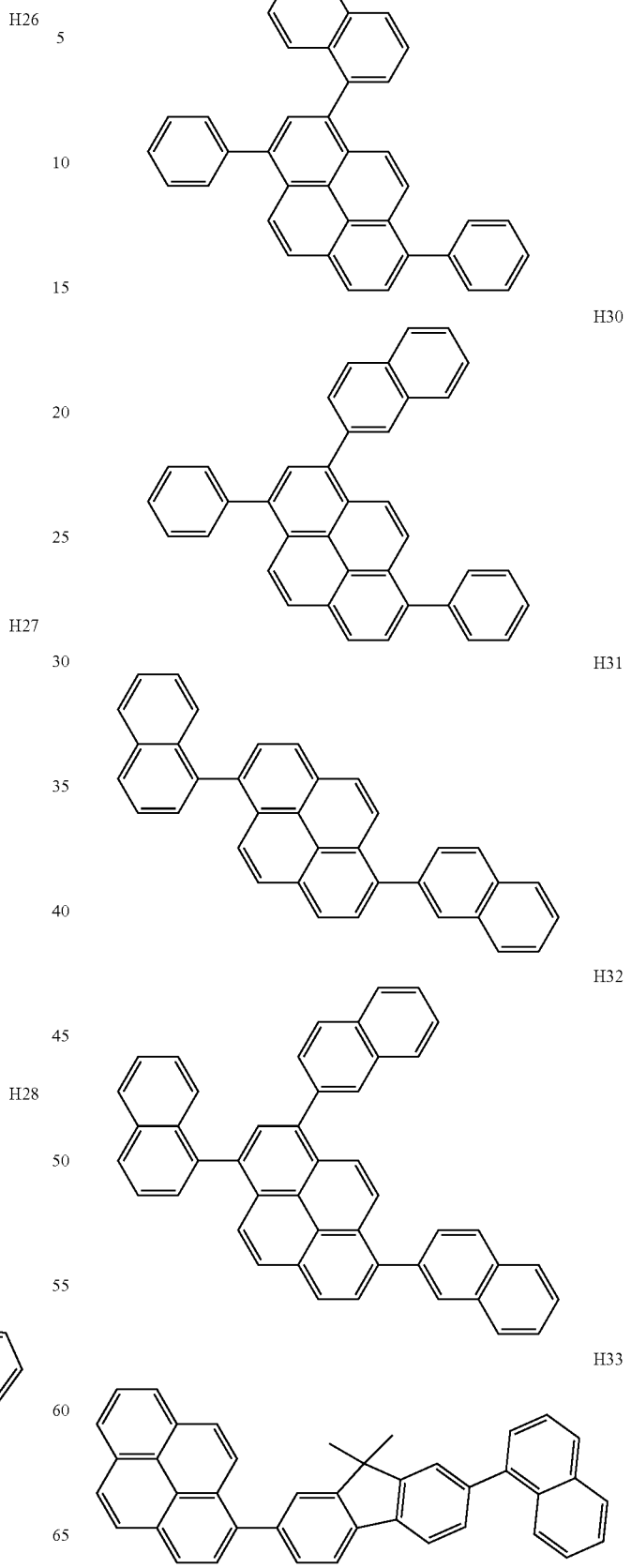

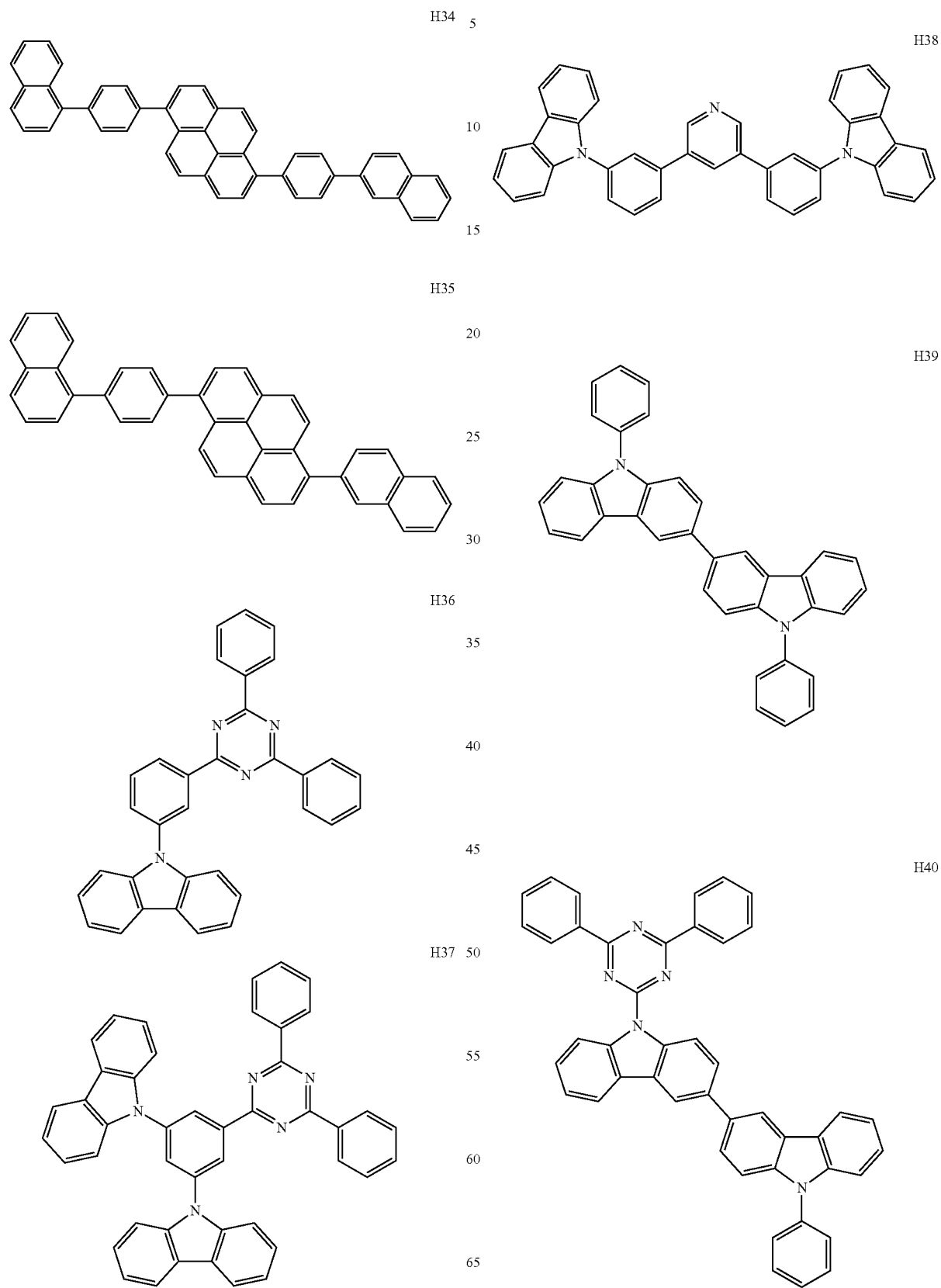

H41 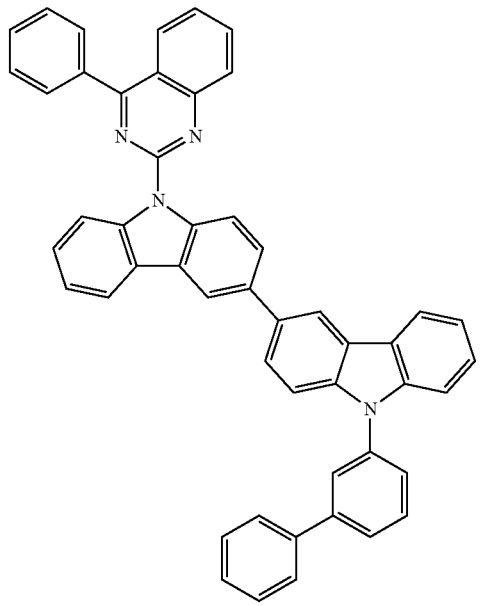
H42 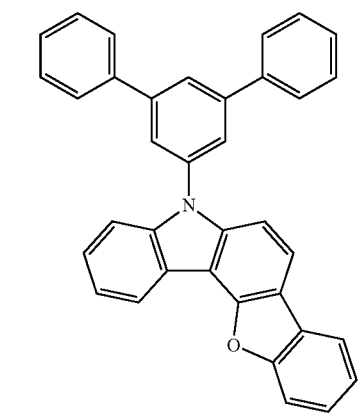
H43 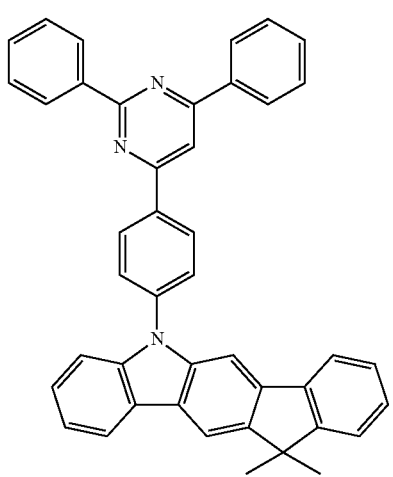
H44 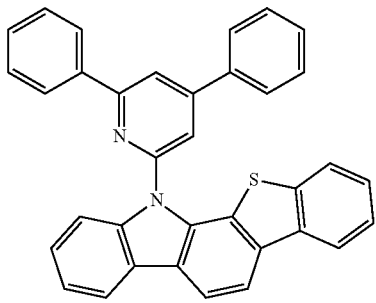
H45 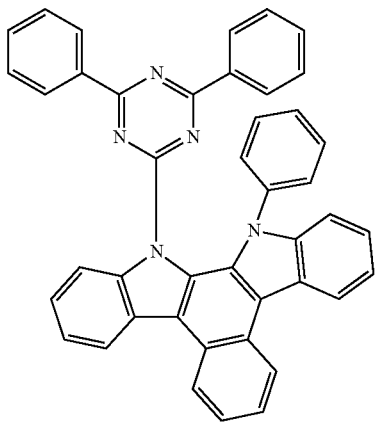
H46 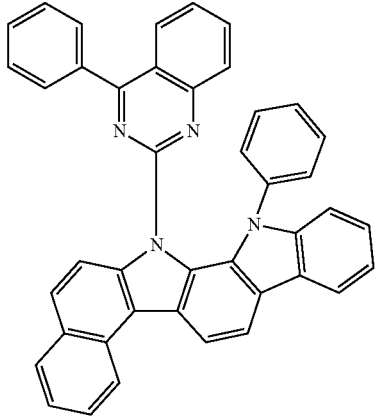
H47 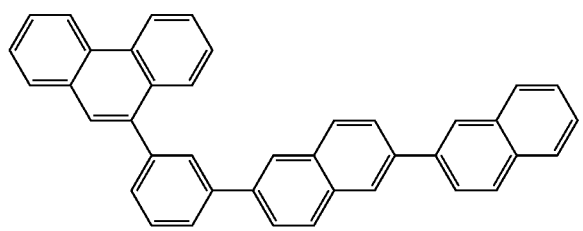
H48 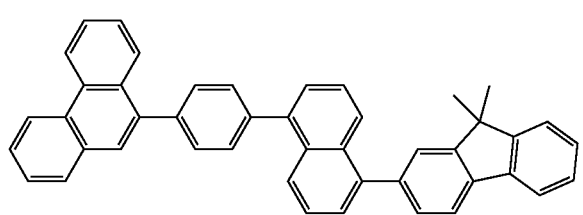

H49
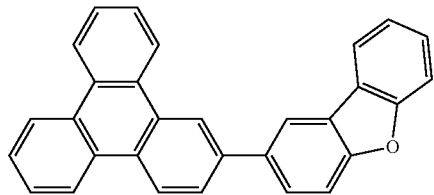

H50
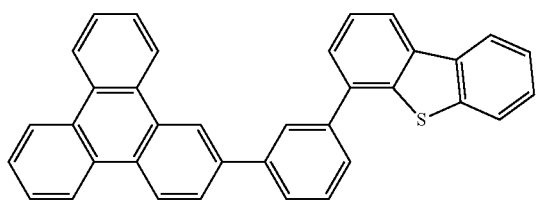

H51
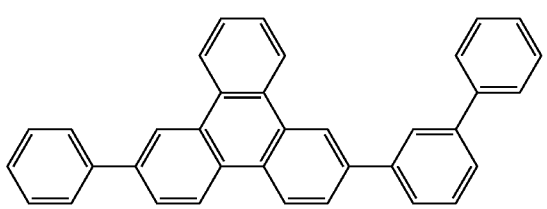

H52
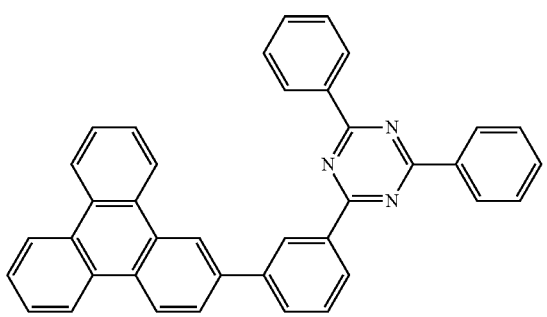

H53
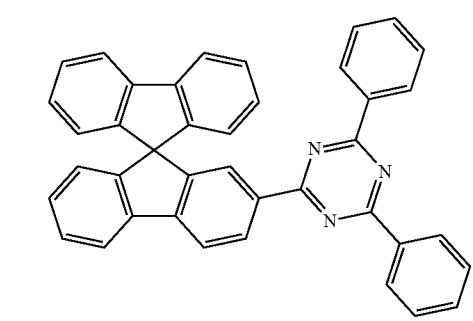

H54
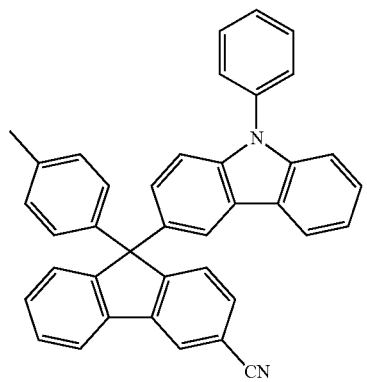

H55
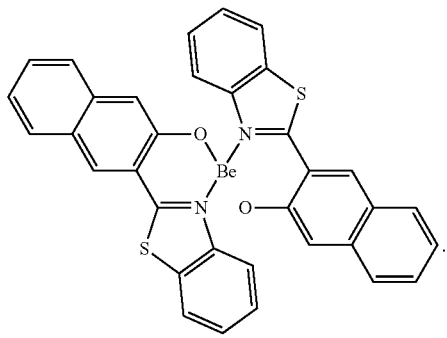

(Phosphorescent Dopant Included in Emission Layer)

The phosphorescent dopant may include an organometallic complex represented by Formula 401 which includes a ligand represented by Formula 402:

$$M(L_{401})_{xc1}(L_{402})_{xc2}$$ Formula 401

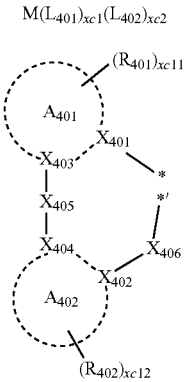

Formula 402 wherein, in Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer selected from 0 to 4, and when xc2 is 2 or greater, at least two $L_{402}$(s) may be identical to or different from each other, $X_{401}$ to $X_{404}$ may each independently be a nitrogen or a carbon, $X_{401}$ and $X_{403}$ may be bound to each other via a single bond or a double bond, and $X_{402}$ and $X_{404}$ may be bound to each other via a single bond or a double bond, $A_{401}$ and $A_{402}$ may each independently be a $C_5$-$C_{60}$ carbocyclic group or a $C_1$-$C_{60}$ heterocyclic group, $X_{405}$ may be selected from a single bond, *—O—*', *—S—*', *—C(=O)—*', *—N($Q_{411}$)—*', *—C($Q_{411}$)($Q_{412}$)—*', *—C($Q_{411}$)=C($Q_{412}$)—*', *—C($Q_{411}$)=*', and *=C=*', wherein $Q_{411}$ and $Q_{412}$ may be selected from hydrogen, deuterium, a $C_1$-$C_{20}$ alkyl group, a $C_1$-$C_{20}$ alkoxy group, a phenyl group, a biphenyl group, a terphenyl group, and a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($C)_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and * and *' in Formula 402 each indicate a binding site to M in Formula 401.

In an exemplary embodiment of the present inventive concept, in Formula 402, $A_{401}$ and $A_{402}$ may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In an exemplary embodiment of the present inventive concept, in Formula 402, i) $X_{401}$ may be nitrogen, and $X_{402}$ may be carbon, or ii) $X_{401}$ and $X_{402}$ may each be nitrogen.

In an exemplary embodiment of the present inventive concept, in Formula 402, $R_{401}$ and $R_{402}$ may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantyl group, a norbornanyl group, and a norbornenyl group;

a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but the present inventive concept is not limited thereto.

In an exemplary embodiment of the present inventive concept, when xc1 in Formula 401 is 2 or greater, two $A_{401}$(s) of at least two $L_{401}$(s) may optionally be linked via $X_{407}$ as a linking group; or two $A_{402}$(s) may optionally be linked via $X_{408}$ as a linking group (see Compounds PD1 to PD4 and PD7 as shown below). $X_{407}$ and $X_{408}$ may each independently be selected from a single bond, *—O—*', *—S—*', *—C(=O)—*', *—N($Q_{413}$)—*', *—C($Q_{413}$)($Q_{414}$)—*', and *—C($Q_{413}$)=C($Q_{414}$)—*', wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, but the present inventive concept is not limited thereto.

$L_{402}$ in Formula 401 may be any suitable monovalent, divalent, or trivalent organic ligand. For example, $L_{402}$ may be selected from halogen, diketone (e.g., acetylacetonate), a carboxylic acid (e.g., picolinate), —C(=O), isonitrile, —CN, and phosphorus (e.g., phosphine or phosphite), but the present inventive concept is not limited thereto.

In an exemplary embodiment of the present inventive concept, the phosphorescent dopant may include, for example, at least one selected from Compounds PD1 to PD25, but the present inventive concept is not limited thereto:

PD1
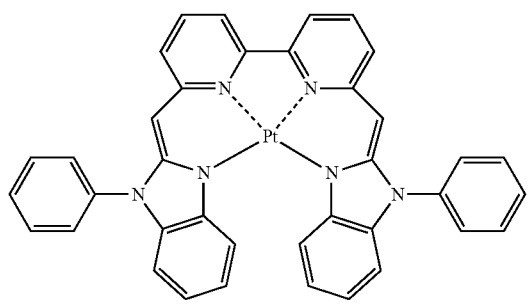
PD2
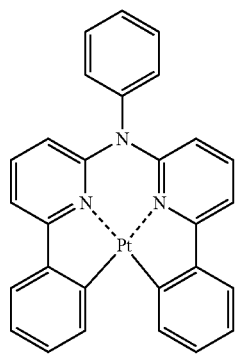
PD3
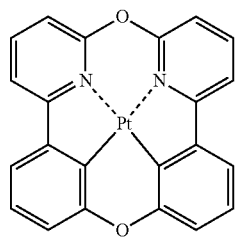
PD4
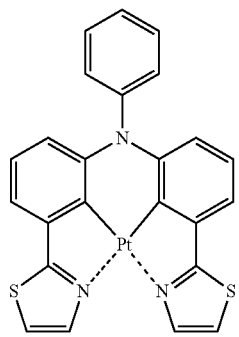
PD5
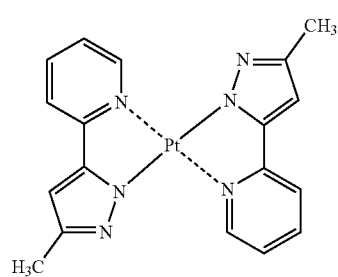
PD6
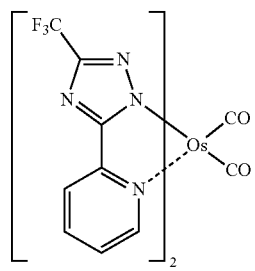
PD7
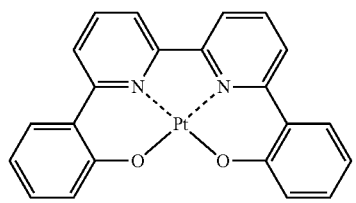
PD8
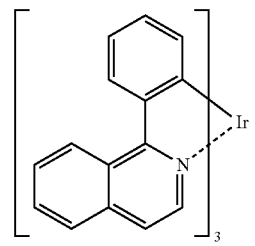
PD9
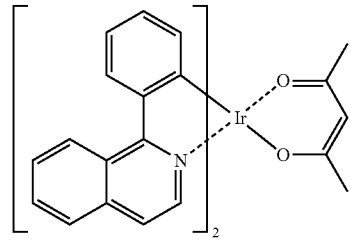
PD10
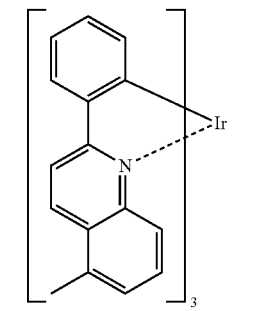
PD11
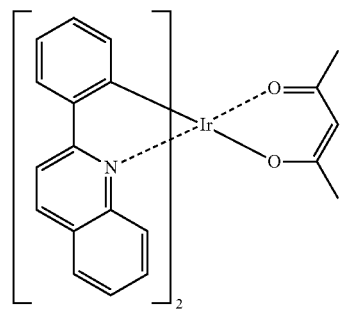

PD12 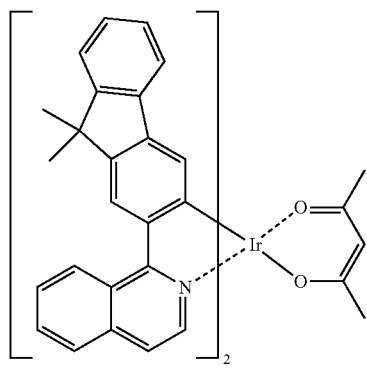
PD13 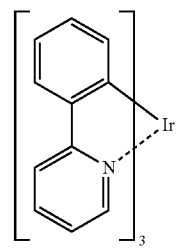
PD14 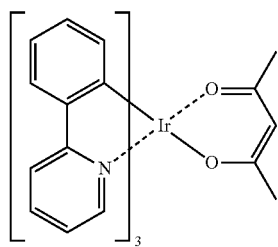
PD15 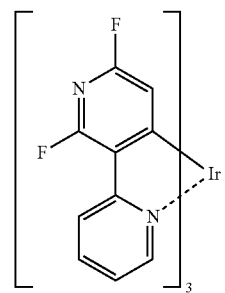
PD16 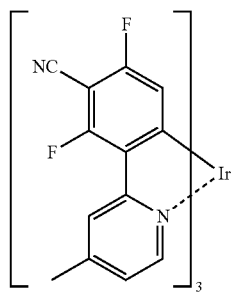
PD17 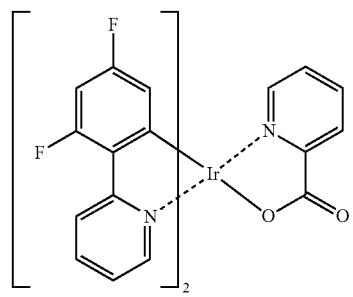
PD18 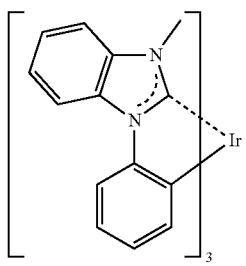
PD19 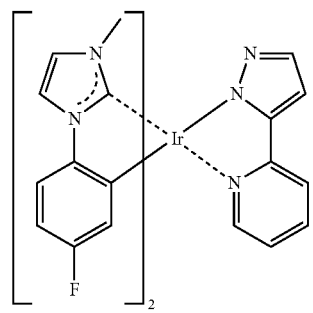
PD20 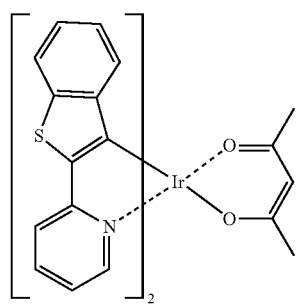
PD21 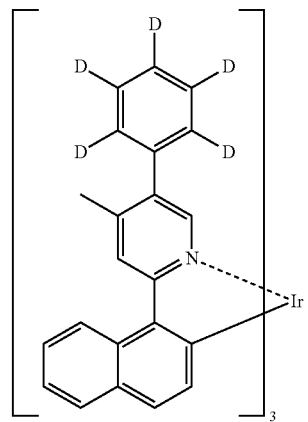

-continued

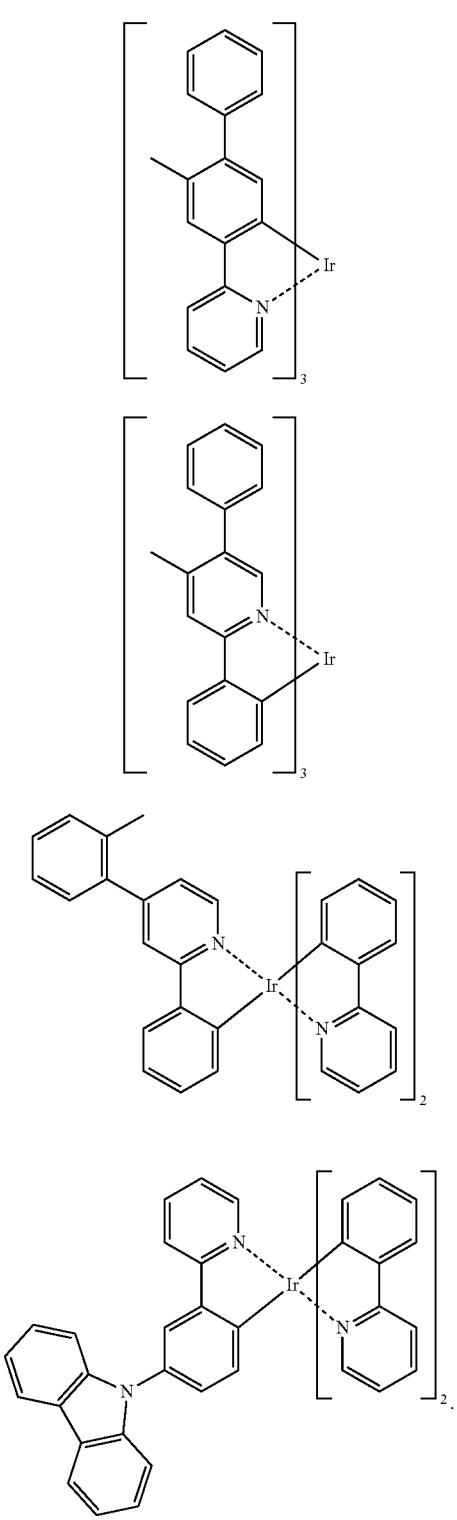

(Fluorescent Dopant in Emission Layer)

The fluorescent dopant may include an arylamine compound or a styrylamine compound.

In an exemplary embodiment of the present inventive concept, the fluorescent dopant may include a compound represented by Formula 501:

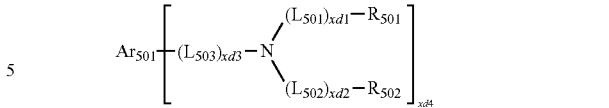

wherein, in Formula 501, $Ar_{501}$ may be selected from a substituted or unsubstituted $C_5$-$C_{60}$ carbocyclic group and a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In an exemplary embodiment of the present inventive concept, in Formula 501, $Ar_{501}$ may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an exemplary embodiment of the present inventive concept, in Formula 501, $L_{501}$ to $L_{503}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In an exemplary embodiment of the present inventive concept, in Formula 501, $R_{501}$ and $R_{502}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In an exemplary embodiment of the present inventive concept, xd4 in Formula 501 may be 2, but the present inventive concept is not limited thereto.

In an exemplary embodiment of the present inventive concept, the fluorescent dopant may be selected from, for example, Compounds FD1 to FD22:

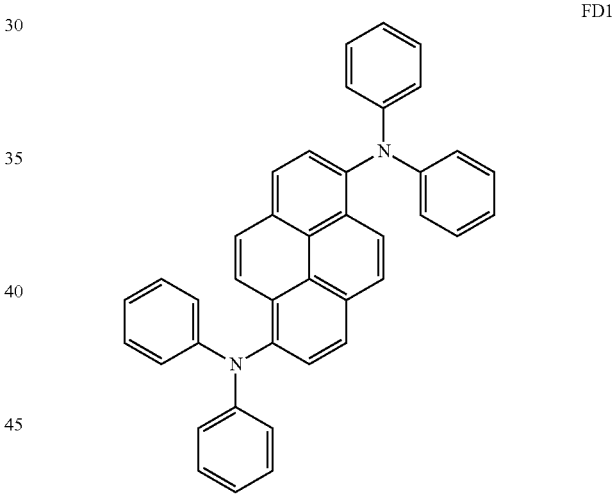

FD1

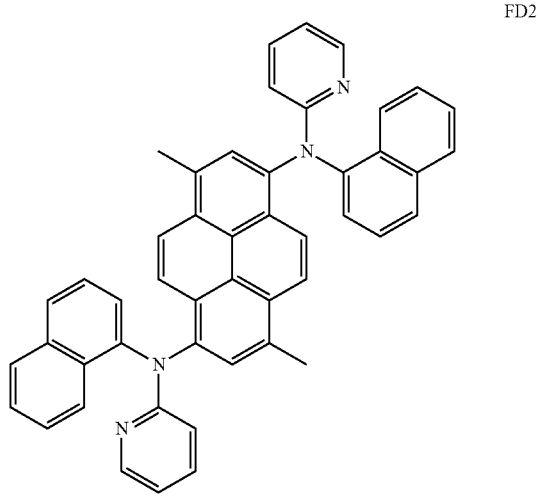

FD2

FD3
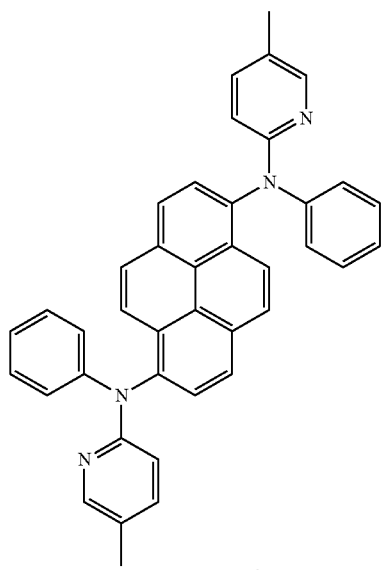
FD4
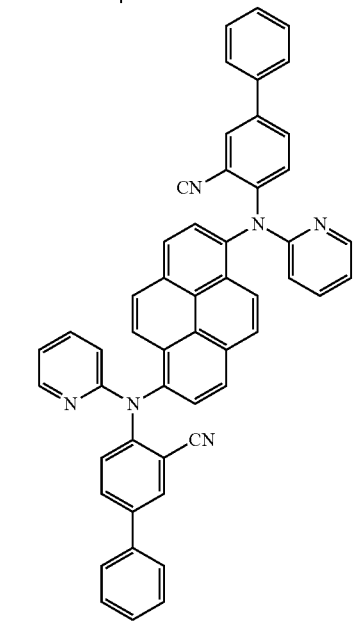
FD5
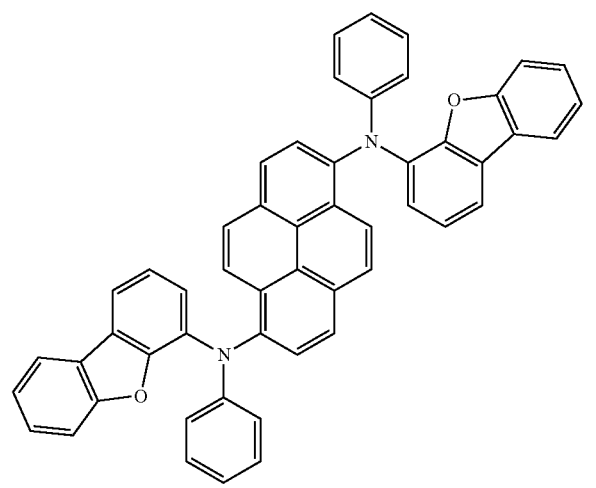
FD6
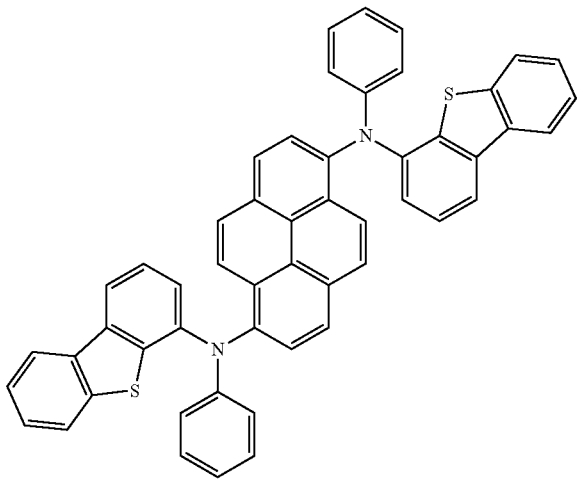
FD7
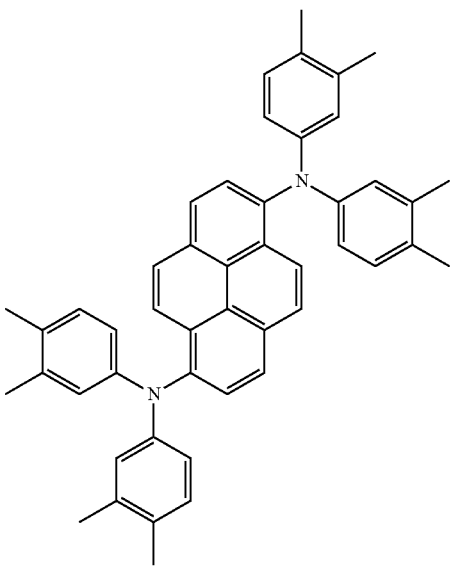
FD8
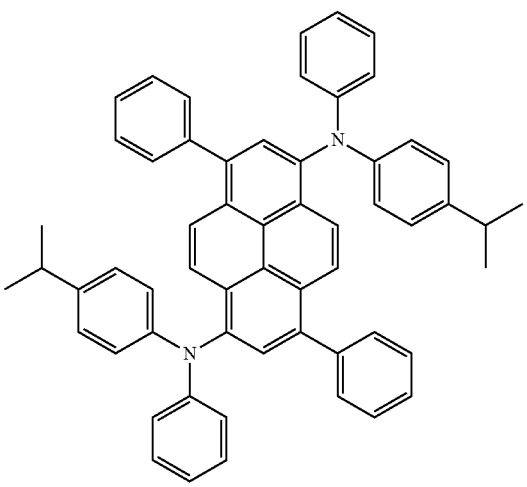

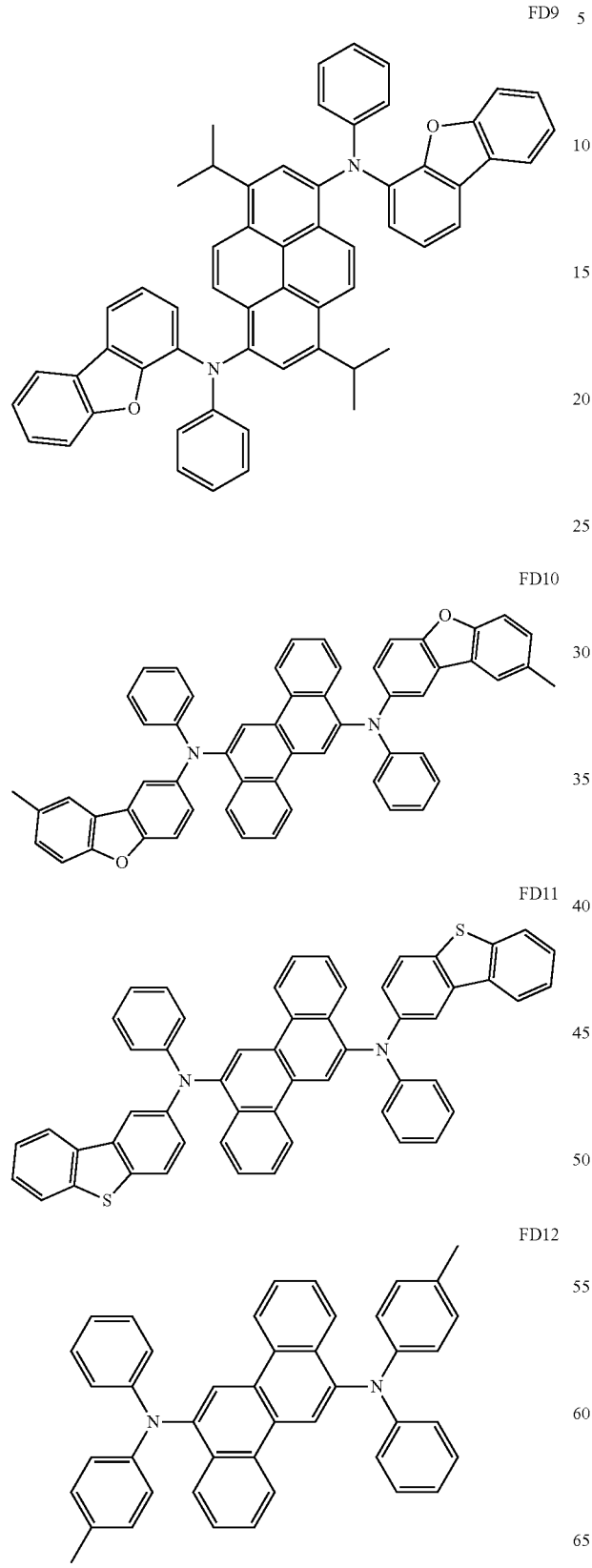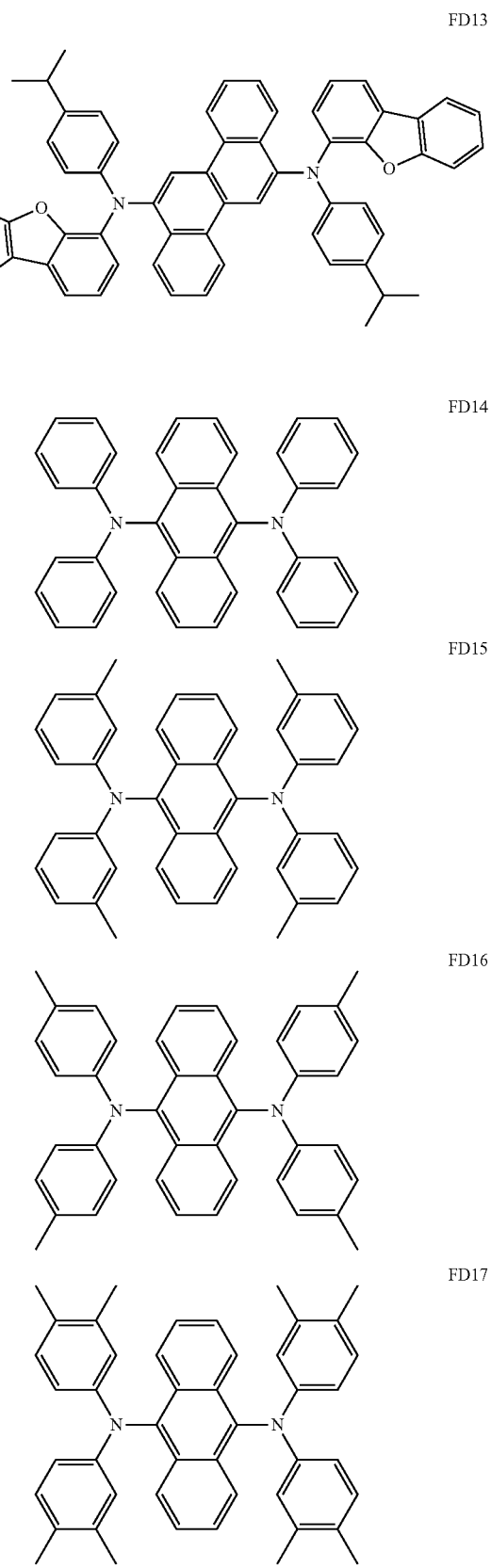

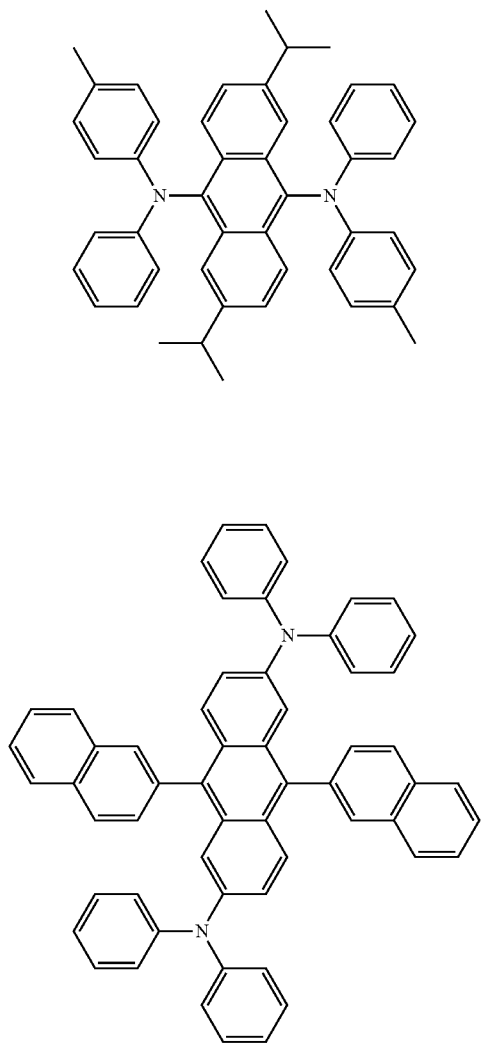
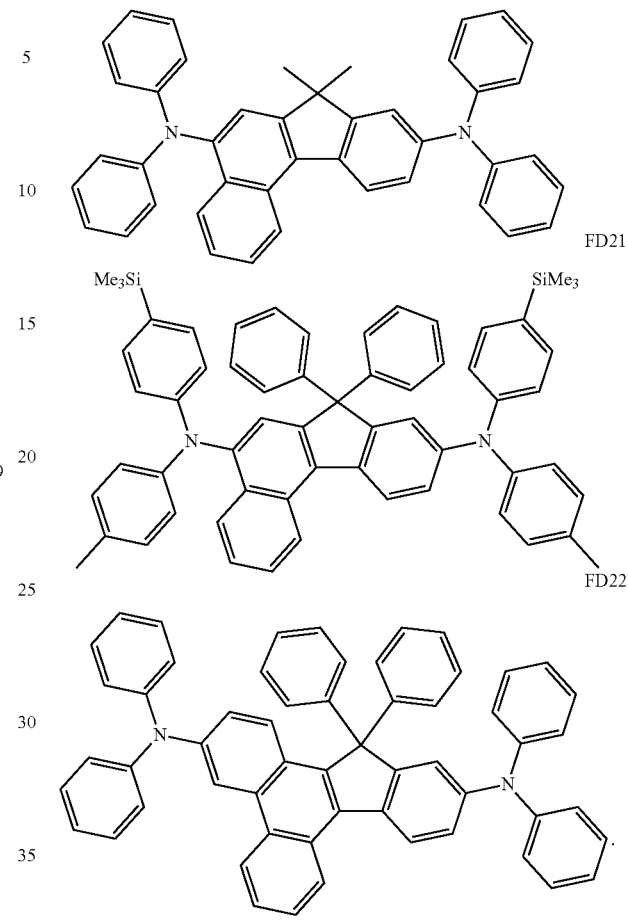
In an exemplary embodiment of the present inventive concept, the fluorescent dopant may be selected from the following compounds, but the present inventive concept is not limited thereto:
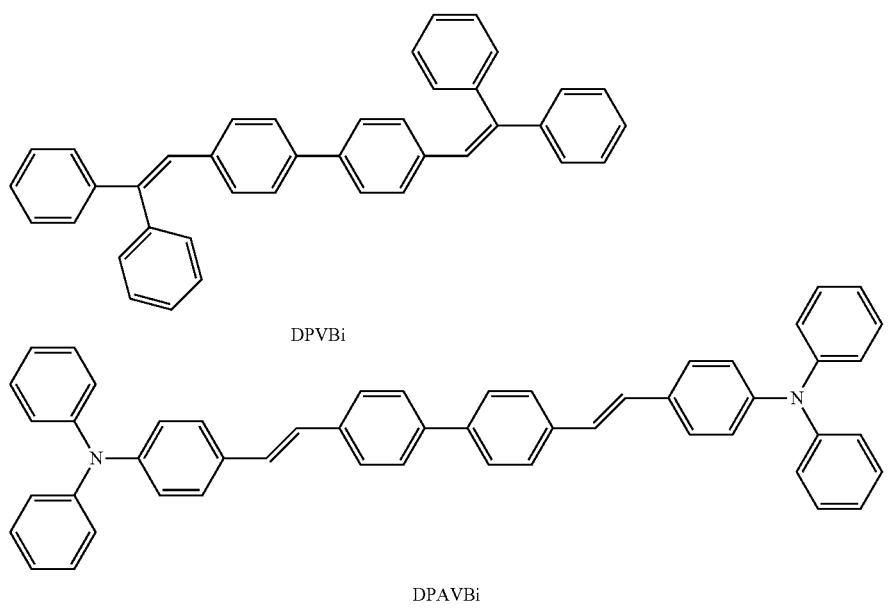

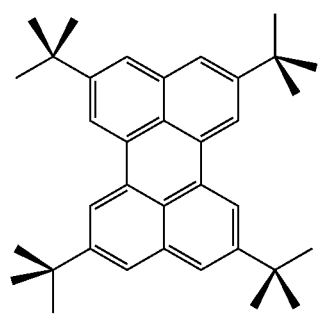
TBPe

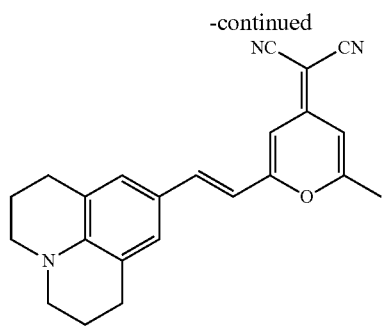
DCM

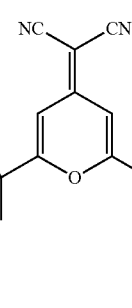
DCJTB

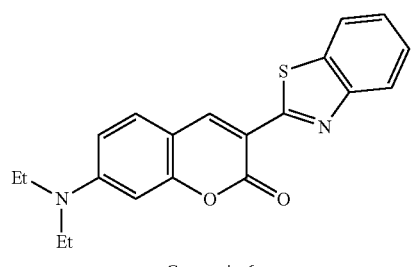
Coumarin 6

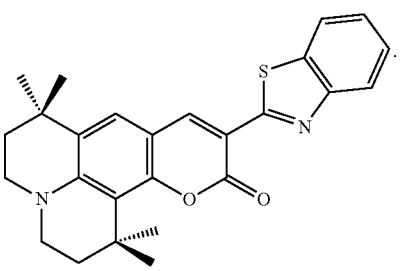
C545T (Quantum Dot)

When the electronic device is a quantum dot light-emitting device, an emission layer of the quantum dot light-emitting device may include a quantum dot.

In an exemplary embodiment of the present inventive concept, when the electronic apparatus includes a color-conversion layer, the color-conversion layer may include a quantum dot. The quantum dot fluorescent material or a phosphorescent material when used in a display device can produce pure monochromatic red, green, and blue light.

The quantum dot is a particle having a crystal structure of several to tens of nanometers in size. The quantum dot may include hundreds to thousands of atoms.

Since the quantum dot is very small in size, quantum confinement effect may occur. The quantum confinement is a phenomenon in which a band gap of an object becomes larger when the object becomes smaller than a nanometer size. Accordingly, when light of a wavelength having an energy larger than a band gap of the quantum dot is incident on the quantum dot, the quantum dot is excited by absorbing the light, emits light of a specific wavelength, and falls to the ground state. In this case, the wavelength of the emitted light may have an energy value corresponding to the band gap. Since the emitted light of the specific wavelength has an energy value corresponding to the band gap, by selecting materials of the quantum dot having different band gaps will convert the incident light on the quantum dot to different wavelengths. For example, light of a desired wavelength range may be obtained by controlling the composition of the quantum dot.

A core of the quantum dot may include a II-VI compound, a III-VI compound, a III-V compound, a IV-VI compound, a Group IV element or compound, a compound, or a combination thereof. The II-VI compound may include one or more of group II elements such as, for example, zinc (Zn), cadmium (Cd), mercury (Hg) beryllium (Be), magnesium (Mg), calcium (Ca), strontium (Sr), barium (Ba), and radium (Ra), and one or more of group VI elements such as, for example, oxygen (O), sulfur (S), selenium (Se), tellurium (Te), polonium (Po), chromium (Cr), molybdenum (Mo), tungsten (W), and uranium (U). For example, the II-VI compound may be selected from a binary compound including, for example, CdS, CdSe, CdTe, ZnS, ZnSe, ZnTe, ZnO, HgS, HgSe, HgTe, MgSe, MgS, or a mixture thereof; a ternary compound including, for example, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; and a quaternary compound including, for example, CdZnSeS, CdZnSeTe, CdZnSTe, CdHgSeS, CdHgSeTe, CdHgSTe, HgZnSeS, HgZnSeTe, HgZnSTe, or a mixture thereof.

The III-VI compound may include one or more of group III elements such as, for example, scandium (Sc), yttrium (Y), lanthanum (La), boron (B), aluminum (Al), gallium (Ga), indium (In), and thallium (Tl), and one or more of group VI elements such as, for example, oxygen (O), sulfur (S), selenium (Se), tellurium (Te), polonium (Po), chromium (Cr), molybdenum (Mo), tungsten (W), and uranium (U). For example, the III-VI compound may include a binary compound such as $In_2S_3$ or $In_2Se_3$; a ternary compound such as $InGaS_3$ or $InGaSe_3$; or any combination thereof.

The III-V compound may include one or more of group III elements such as, for example, scandium (Sc), yttrium (Y), lanthanum (La), boron (B), aluminum (Al), gallium (Ga), indium (In), and thallium (Tl), and one or more of group V elements such as, for example, nitrogen (N), phosphorus (P), arsenic (As), antimony (Sb), and bismuth (Bi). For example, the III-V compound may be selected from a binary compound including, for example, GaN, GaP, GaAs, GaSb, AlN, AlP, AlAs, AlSb, InN, InP, InAs, InSb, or a mixture thereof; a ternary compound including, for example, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, or a mixture thereof; and a quaternary compound including, for example, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The III-V semiconductor compound may further include a Group II metal (e.g., InZnP).

The IV-VI compound may include one or more of group IV elements such as, for example, carbon (C), silicon (Si), germanium (Ge), tin (Sn), lead (Pb), titanium (Ti), zirconium (Zi), hafnium (Hf), and thorium (Th), and one or more of group VI elements such as, for example, oxygen (O), sulfur (S), selenium (Se), tellurium (Te), polonium (Po), chromium (Cr), molybdenum (Mo), tungsten (W), and uranium (U). For example, the IV-VI compound may be selected from a binary compound including, for example, SnS, SnSe, SnTe, PbS, PbSe, PbTe, or a mixture thereof; a ternary compound including, for example, SnSeS, SnSeTe, SnSTe, PbSeS, PbSeTe, PbSTe, SnPbS, SnPbSe, SnPbTe, or a mixture thereof; and a quaternary compound including, for example, SnPbSSe, SnPbSeTe, SnPbSTe, or a mixture thereof. In an exemplary embodiment of the present inventive concept, the Group IV element may include, for example, Si, Ge, or a mixture thereof, and the IV compound may be a binary compound include, for example, SiC, SiGe, or a mixture thereof.

The compound may include one or more of group I elements such as, for example, lithium (Li), sodium (Na), potassium (K), rubidium (Rb), cesium (Cs), francium (Fr), copper (Cu), silver (Ag), and gold (Au), one or more of group III elements such as, for example, scandium (Sc), yttrium (Y), lanthanum (La), boron (B), aluminum (Al), gallium (Ga), indium (In), and thallium (Tl), and one or more of group VI elements such as, for example, oxygen (O), sulfur (S), selenium (Se), tellurium (Te), polonium (Po), chromium (Cr), molybdenum (Mo), tungsten (W), and uranium (U). For example, the semiconductor compounds may include a ternary compound such as, for example, AgInS, $AgInS_2$, CuInS, $CuInS_2$, $CuGaO_2$, $AgGaO_2$, $AgAlO_2$, or any combination thereof.

In this exemplary embodiment, the binary compound, the ternary compound, or the quaternary compound may be present in particles at a uniform concentration or in the same particle by being partially divided into different concentrations. In addition, one quantum dot may have a core-shell structure surrounding another quantum dot. An interface between a core and a shell may have a concentration gradient where a concentration of elements present in the shell decreases toward the center.

In an exemplary embodiment of the present inventive concept, the quantum dot may have a core-shell structure including a core including the nanocrystals described above and a shell surrounding the core. The shell of the quantum dot may serve as a protective layer for preventing chemical denaturation of the core to maintain semiconductor characteristics and/or as a charging layer for imparting electrophoretic characteristics to the quantum dot. The shell may be monolayer or multilayer. An interface between a core and a shell may have a concentration gradient where a concentration of elements present in the shell decreases toward the center. Examples of the shell of the quantum dot include metal or nonmetal oxide, a semiconductor compound, or a combination thereof.

In an exemplary embodiment of the present inventive concept, the metal or nonmetal oxide included in the shell of the quantum dot may be a binary compound such as, for example, silicon oxide ($SiO_2$), aluminum oxide ($Al_2O_3$), titanium oxide ($TiO_2$), zinc oxide (ZnO), manganese oxide (MnO, $Mn_2O_3$, $Mn_3O_4$), copper oxide (CuO), Iron oxide (FeO, $Fe_2O_3$, $Fe_3O_4$), cobalt oxide (CoO, $Co_3O_4$), or nickel oxide (NiO), or a ternary compound such as, for example, magnesium aluminum oxide ($MgAl_2O_4$), cobalt ferrite ($CoFe_2O_4$), nickel ferrite ($NiFe_2O_4$), or cobalt manganese oxide ($CoMn_2O_4$), but the present inventive concept is not limited thereto.

The semiconductor compound included in the shell of the quantum dot may be, for example, cadmium sulfide (CdS), cadmium selenide (CdSe), cadmium telluride (CdTe), zinc sulfide (ZnS), zinc selenide (ZnSe), zinc telluride (ZnTe), zinc selenium sulfide (ZnSeS), zinc tellurium sulfide (ZnTeS), gallium arsenide (GaAs), gallium phosphide (GaP), gallium antimonide (GaSb), mercury sulfide (HgS), mercury selenide (HgSe), mercury telluride (HgTe), indium arsenide (InAs), indium phosphide (InP), indium gallium phosphide (InGaP), indium antimonide (InSb), aluminum arsenide (AlAs), aluminum phosphide (AlP), or aluminum antimonide (AlSb), but the present inventive concept is not limited thereto.

The quantum dot may have a full width of half maximum (FWHM) of a spectrum of an emission wavelength of about 45 nm or less, about 40 nm or less, or about 30 nm or less. When the FWHM of the quantum dot is within this range, color purity or color reproducibility may be enhanced. In addition, since light emitted through the quantum dot is emitted in all directions, an optical viewing angle may be enhanced.

The form of the quantum dot may be a form generally used in the art and is not particularly limited. The quantum dot may be, for example, a spherical form, a pyramidal form, a multi-armed form, or a cubic nanoparticle, a nanotube, a nanowire, a nanofiber, a nano-plate particle, or the like.

Light of a desired wavelength range may be obtained by controlling the composition of the quantum dot, for example, controlling band gap of the quantum dot. On the other hand, even quantum dot that includes the same material may emit different wavelengths according to its particle size. Thus, the quantum dot may control color of emitted light according to the particle size. Since the smaller the quantum dot, the shorter the wavelength of light emitted from the quantum dot, light of a desired wavelength range may be obtained by controlling the size of the quantum dot. Accordingly, the quantum dot may have various emission colors such as blue, red, or green.

When each layer included in the interlayer is formed by vacuum deposition, the vacuum deposition may be performed at a deposition temperature in a range from about 100° C. to about 500° C., at a vacuum degree in a range from about $10^{-8}$ torr to about $10^{-3}$ torr, and at a deposition rate in a range from about 0.01 Angstroms per second (Å/sec) to about 100 Å/sec, depending on the material to be included in each layer and the structure of each layer to be formed.

When each layer included in the interlayer is formed by spin coating, the spin coating may be performed at a coating rate of about 2,000 revolutions per minute (rpm) to about 5,000 rpm, and at a heat treatment temperature of about 80° C. to about 200° C., depending on the material to be included in each layer and the structure of each layer to be formed.

(Second Electrode)

A second electrode may be disposed on the interlayer. The second electrode may be a cathode that is an electron injection electrode, and in this regard, a material for forming the second electrode may be a material having a low work function, and such a material may be, for example, metal, alloy, an electrically conductive compound, or a combination thereof.

The second electrode may include at least one selected from lithium (Li), silver (Ag), magnesium (Mg), aluminum (Al), aluminum-lithium (Al—Li), calcium (Ca), ytterbium (Yb), silver-magnesium (Ag—Mg), silver-ytterbium (Ag—Yb), magnesium-indium (Mg—In), ITO, or IZO, but the present inventive concept is not limited thereto.

The second electrode may be a transmissive electrode, a semi-transmissive electrode, or a reflective electrode.

The second electrode may have a single-layered structure, or a multi-layered structure including two or more layers. In an exemplary embodiment of the present inventive concept, the second electrode may have a structure in which a layer including silver-magnesium (Ag—Mg) and a layer including yttrium (Y) are stacked.

General Definitions of Substituents

The term "$C_1$-$C_{60}$ alkyl group" as used herein refers to a linear or branched aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group including at least one heteroatom selected from nitrogen (N), oxygen (O), silicon (Si), phosphorus (P), and sulfur (S) as a ring-forming atom and 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from nitrogen (N), oxygen (O), silicon (Si), phosphorus (P), and sulfur (S) as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$O_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system having at least one heteroatom selected from nitrogen (N), oxygen (O), silicon (Si), phosphorus (P), and sulfur (S) as a ring-forming atom and 1 to 60 carbon atoms. The term "$C_1$-$C_{60}$ heteroarylene group" as used herein refers to a divalent group having a heterocyclic aromatic system having at least one heteroatom selected from nitrogen (N), oxygen (O), silicon (Si), phosphorus (P), and sulfur (S) as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "monovalent non-aromatic condensed polycyclic group" as used herein refers to a monovalent group that has two or more rings condensed and only carbon atoms as ring forming atoms (e.g., 8 to 60 carbon atoms), wherein the entire molecular structure is non-aromatic. Examples of the monovalent non-aromatic condensed polycyclic group may include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom selected from nitrogen (N), oxygen (O), silicon (Si), phosphorus (P), and sulfur (S), in addition to carbon atoms (e.g., 1 to 60 carbon atoms), as a ring-forming atom, wherein the entire molecular structure is non-aromatic. Examples of the monovalent non-aromatic condensed heteropolycyclic group may include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{60}$ carbocyclic group" as used herein refers to a monocyclic or polycyclic group having 5 to 60 carbon atoms only as ring-forming atoms. The $C_5$-$C_{60}$ carbocyclic group may be an aromatic carbocyclic group or a non-aromatic carbocyclic group. The term "$C_5$-$C_{60}$ carbocyclic group" as used herein refers to a ring (e.g., a benzene group), a monovalent group (e.g., a phenyl group), or a divalent group (e.g., a phenylene group). Also, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having substantially the same structure as the $C_5$-$C_{60}$ carbocyclic group, except that at least one heteroatom selected from nitrogen (N), oxygen (O), silicon (Si), phosphorus (P), and sulfur (S) is used as a ring-forming atom, in addition to carbon atoms (e.g., 1 to 60 carbon atoms).

In the present specification, at least one of substituents of the substituted $C_3$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$—$O_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($O_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein refers to a phenyl group. The term "Me" as used herein refers to a methyl group. The term "Et" as used herein refers to an ethyl group. The term "ter-Bu" or "Bu$^t$" as used herein refers to a tert-butyl group. The term "OMe" as used herein refers to a methoxy group.

The term "biphenyl group" as used herein refers to a phenyl group substituted with a phenyl group. The "biphenyl group" may be a substituted phenyl group having a $C_6$-$C_{60}$ aryl group as a substituent.

The term "terphenyl group" as used herein refers to a phenyl group substituted with a biphenyl group. The "terphenyl group" may be a substituted phenyl group having a $C_6$-$C_{60}$ aryl group substituted with a $C_6$-$C_{60}$ aryl group as a substituent.

The symbols * and *' as used herein, unless defined otherwise, refer to a binding site to an adjacent atom in a corresponding formula.

Hereinafter the compound and the organic light-emitting device according to an exemplary embodiment of the present inventive concept will be described in detail with reference to Examples.

EXAMPLES

Example 1

A composition including 30 parts by weight of glycidyl methacrylate, 5 parts by weight of metal catalyst, 65 parts by weight of 1,12-dodecanediol dimethacrylate as a binder, and 3 parts by weight of 2,4,6-trimethylbenzoyldiphenyl phosphine oxide as an initiator was exposed to ultraviolet rays (UV) of 395 nm for 1 minutes for curing to thereby prepare a hygroscopic material of Example 1. In the above composition, bis(3,5-di-tert-butylsalicylidene)-1,2-cyclohexanediaminocobalt (II) was used as the metal catalyst:

Bis(3,5-di-tert-butylsalicylidene)-1,2-cyclohexanediaminocobalt(II)

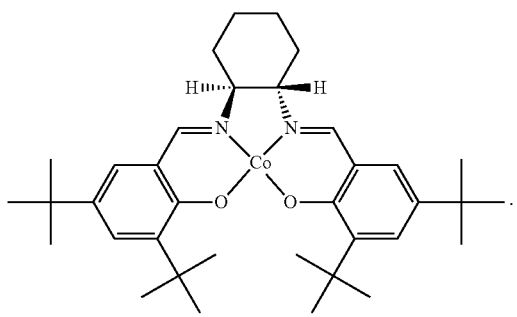

Comparative Example 1

A hygroscopic material of Comparative Example 1 was prepared in substantially the same manner as that in Example 1, except that the metal catalyst was not included.

Evaluation Example 1

The hygroscopic materials of Example 1 and Comparative Example 1 were placed in a cylindrical container filled with water and then sealed. The tendency to absorb moisture was analyzed by measuring the increase in weight over time, and the results are shown in the graph of FIG. 4.

Figure 4:
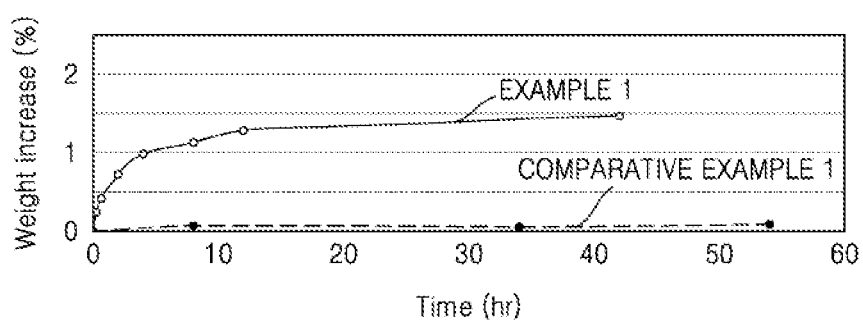
FIG. 4 is a graph of weight increase (percent, %) versus time (hours, hr), showing results of water absorption tendency evaluation of a composition according to an exemplary embodiment of the present inventive concept and a comparative composition.

As shown in FIG. 4, it was found that the hygroscopic material of Example 1 increased in weight by about 1.5%, and the hygroscopic material of Comparative Example 1 increased in weight by about 0.17%.

From the results, it was found that the composition according to an exemplary embodiment of the present inventive concept has an excellent function of absorbing and removing water, as compared with the composition of the Comparative Example, thereby preventing deterioration, when applied to an encapsulating member or filling member of an electronic device, and enhancing durability. In addition, it was found that deterioration of the electronic device may be prevented by preventing external water from penetrating into the electronic device, and accordingly, the reliability of the electronic apparatus may be enhanced.

It is apparent from the foregoing description that as the encapsulating or filling composition removes water ($H_2O$) in an electronic apparatus by chemical reactions, deterioration of an encapsulating member or a filling member due to outgassing and swelling may be prevented, thereby enhancing the durability thereof. In addition, deterioration of the electronic device may be prevented by preventing external water from penetrating into the electronic device, and accordingly, the reliability of the electronic apparatus may be enhanced.

The encapsulating or filling composition according to an exemplary embodiment of the present inventive concept may exhibit excellent water removal performance, thus enabling simplification of a structure of an encapsulating member or filling member and a manufacturing process thereof.

It should be understood that the exemplary embodiments of the present inventive concept described herein should be considered in a descriptive sense only and not for purposes of limitation. Descriptions of features or aspects within each exemplary embodiment should typically be considered as available for other similar features or aspects in other exemplary embodiments. While specific exemplary embodiments have been described with reference to the figures, it will be understood by those of ordinary skill in the art that various changes in form and details may be made therein without departing from the spirit and scope of the present inventive concept as defined by the appended claims.

What is claimed is:

1. An encapsulating or filling composition for electronic devices, the encapsulating or filling composition comprising:
    a first curable material comprising an epoxy group;
    a polymerization initiator; and
    a metal catalyst,
    wherein the metal catalyst is a metal-salen complex represented by Formula 3:

Formula 3

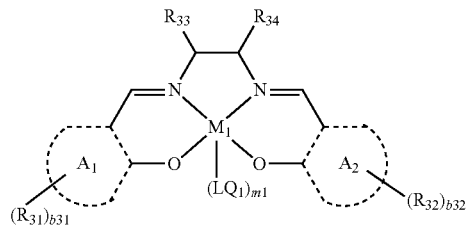

wherein, in Formula 3,
$M_1$ is a metal atom,
$A_1$ and $A_2$ are each independently a benzene group, a naphthalene group, a pyridine group, a thiophene group, or a pyrrole group,
$R_{31}$ to $R_{34}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group,
$R_{31}$ to $R_{34}$ are optionally bound to form a substituted or unsubstituted ring,
b31 and b32 are each independently an integer from 0 to 6,
$LQ_1$ is a monovalent ligand, and
m1 is an integer from 0 to 2.

2. The encapsulating or filling composition of claim 1, wherein the first curable material is a monomer comprising the epoxy group and a (meth)acrylate group.

3. The encapsulating or filling composition of claim 2, wherein the first curable material comprises an epoxy (meth)acrylate compound represented by Formula 1:

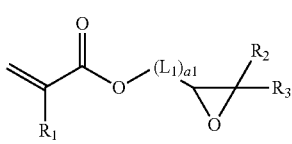

Formula 1 wherein, in Formula 1,
$R_1$ is hydrogen or a methyl group,
$L_1$ is —O—, —S—, —S(=O)$_2$—, —C(=O)—, —C(=O)O—, —C(=O)NH—, —N(R$_4$)—, —C(R$_4$)(R$_5$)—, —Si(R$_4$)(R$_5$)—, or $C_1$-$C_{20}$ alkylene group,
$R_2$ to $R_5$ are each independently selected from hydrogen, deuterium, —F, —Cl, —Br, —I, a hydroxyl group, a cyano group, an epoxy group, a nitro group, an amidino group, a hydrazino group, a hydrazono group, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $C_1$-$C_{20}$ alkoxy group, and
a1 is an integer from 1 to 5.

4. The encapsulating or filling composition of claim 2, further comprising a second curable material, wherein the second curable material comprises at least one of a di(meth)acrylate compound represented by Formula 2-1 and a (meth)acrylate compound represented by Formula 2-2:

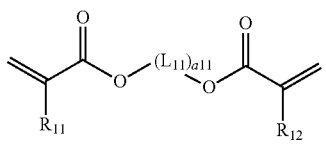

Formula 2-1

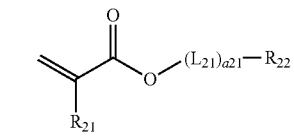

Formula 2-2 wherein, in Formulae 2-1 and 2-2,
$L_{11}$ and $L_{21}$ are each independently —O—, —S—, —S(=O)$_2$—, —C(=O)—, —C(=O)O—, —C(=O)NH—, —N(R$_3$)—, —C(R$_3$)(R$_4$)—, —Si(R$_3$)(R$_4$)—, a substituted or unsubstituted $C_6$-$C_{60}$ arylene group, a substituted or unsubstituted $C_1$-$C_{60}$ heteroarylene group, or a substituted or unsubstituted $C_1$-$C_{20}$ alkylene group,
a11 and a21 are each independently an integer from 1 to 5,
$R_3$ and $R_4$ are each independently selected from hydrogen, deuterium, —F, —Cl, —Br, —I, a hydroxyl group, a cyano group, an epoxy group, a nitro group, an amidino group, a hydrazino group, a hydrazono group, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $C_1$-$C_{20}$ alkoxy group, $R_{11}$, $R_{12}$, and $R_{21}$ are each independently hydrogen or a methyl group, and $R_{22}$ is selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cyclo alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

5. The encapsulating or filling composition of claim 4, wherein, based on 100 parts by weight of the encapsulating or filling composition, a content of the first curable material is in a range from about 1 part to about 20 parts by weight, and a content of the second curable material is in a range from about 40 parts to about 99 parts by weight.

6. The encapsulating or filling composition of claim 2, wherein the polymerization initiator is a photoinitiator.

7. The encapsulating or filling composition of claim 1, wherein the first curable material comprises at least one selected from a bisphenol A glycidyl ether resin, a bisphenol F glycidyl ether resin, a novolac epoxy resin, an aliphatic glycidyl ether, a cycloaliphatic epoxy resin, and a brominated epoxy resin.

8. The encapsulating or filling composition of claim 7, wherein the polymerization initiator is a thermal initiator.

9. The encapsulating or filling composition of claim 7, further comprising at least one of a thermal stabilizer, a curing agent, or a photo acid generator.

10. The encapsulating or filling composition of claim 1, wherein a content of the metal catalyst is in a range from about 0.1 parts to about 10 parts by weight, based on 100 parts by weight of the encapsulating or filling composition.

11. An electronic apparatus comprising:
a first substrate;
an electronic device disposed on the first substrate; and
one or more cured materials of an encapsulating or filling composition formed on the electronic device,
wherein the encapsulating or filling composition comprises:
a curable material comprising an epoxy group;
a polymerization initiator; and
a metal catalyst, wherein the metal catalyst is a metal-salen complex represented by Formula 3:

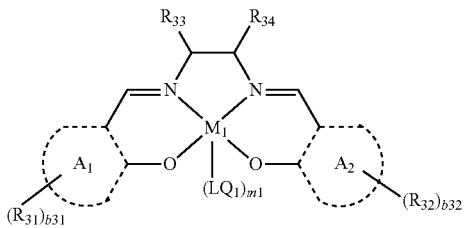

Formula 3 wherein, in Formula 3, $M_1$ is a metal atom, $A_1$ and $A_2$ are each independently a benzene group, a naphthalene group, a pyridine group, a thiophene group, or a pyrrole group, $R_{31}$ to $R_{34}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{31}$ to $R_{34}$ are optionally bound to form a substituted or unsubstituted ring, b31 and b32 are each independently an integer from 0 to 6, $LQ_1$ is a monovalent ligand, and m1 is an integer from 0 to 2.

12. The electronic apparatus of claim 11, further comprising an encapsulating member encapsulating the electronic device.

13. The electronic apparatus of claim 12, wherein the encapsulating member comprises a first cured material of the encapsulating or filling composition.

14. The electronic apparatus of claim 13, wherein the encapsulating member comprises a thin film encapsulation unit comprising an organic film, and the organic film comprises the first cured material of the encapsulating or filling composition.

15. The electronic apparatus of claim 12, further comprising:
 a second substrate disposed on the encapsulating member; and
 a filling member formed between the encapsulating member and the second substrate,
 wherein the filling member comprises a second cured material of the encapsulating or filling composition.

16. The electronic apparatus of claim 15, further comprising a color-conversion layer disposed between the filling member and the second substrate, wherein the color-conversion layer comprises a quantum dot.

17. The electronic apparatus of claim 11, wherein the electronic device is a light-emitting device comprising:
 a first electrode;
 a second electrode facing the first electrode; and
 an interlayer interposed between the first electrode and the second electrode and comprising an emission layer.

18. The electronic apparatus of claim 17, wherein the light-emitting device is an organic light-emitting device, and the interlayer of the organic light-emitting device comprises at least one emission unit comprising the emission layer.

19. The electronic apparatus of claim 17, wherein the light-emitting device is a quantum dot light-emitting device, and the emission layer comprises a quantum dot.

\* \* \* \* \*